(12) United States Patent
Chang et al.

(10) Patent No.: US 8,178,280 B2
(45) Date of Patent: May 15, 2012

(54) SELF-CONTAINED PROXIMITY EFFECT CORRECTION INSPIRATION FOR ADVANCED LITHOGRAPHY (SPECIAL)

(75) Inventors: Shih-Ming Chang, Hsin Chu (TW); Shy-Jay Lin, Jhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 211 days.

(21) Appl. No.: 12/700,880

(22) Filed: Feb. 5, 2010

(65) Prior Publication Data

US 2011/0195359 A1  Aug. 11, 2011

(51) Int. Cl.
G03C 5/00 (2006.01)
(52) U.S. Cl. ......... 430/296; 430/396; 430/397; 430/942
(58) Field of Classification Search .................. 430/296, 430/396, 397, 942
See application file for complete search history.

(56) References Cited

U.S. PATENT DOCUMENTS

| | | |
|---|---|---|
| 3,667,830 A | 6/1972 | Rottmiller |
| 3,681,103 A | 8/1972 | Brown |
| 3,971,860 A | 7/1976 | Broers et al. |
| 4,213,053 A | 7/1980 | Pfeiffer |
| 4,264,711 A | 4/1981 | Greeneich |
| 4,450,062 A | 5/1984 | Macaulay |
| 4,463,265 A | 7/1984 | Owen et al. |
| 4,498,010 A | 2/1985 | Biechler et al. |
| 4,621,371 A | 11/1986 | Goton et al. |
| 4,712,013 A | 12/1987 | Nishimura et al. |
| 4,743,766 A | 5/1988 | Nakasuji et al. |
| 4,746,587 A | 5/1988 | Nicholas |
| 4,761,560 A | 8/1988 | Glendinning |
| 4,812,962 A | 3/1989 | Witt |
| 4,816,361 A | 3/1989 | Glendinning |
| 4,998,020 A | 3/1991 | Misaka et al. |
| 5,008,553 A | 4/1991 | Abe |
| 5,057,462 A | 10/1991 | Eisenberg et al. |
| 5,082,762 A | 1/1992 | Takahashi |
| 5,097,138 A | 3/1992 | Wakabayashi et al. |
| 5,112,466 A | 5/1992 | Ohta et al. |
| 5,130,213 A | 7/1992 | Berger et al. |
| 5,177,367 A | 1/1993 | Suzuki |
| 5,229,320 A | 7/1993 | Ugajin |
| 5,241,185 A | 8/1993 | Meiri et al. |
| 5,254,438 A | 10/1993 | Owen et al. |
| 5,336,892 A | 8/1994 | Dobisz et al. |
| 5,441,849 A | 8/1995 | Shiraishi et al. |
| 5,518,572 A | 5/1996 | Kinoshita et al. |
| 5,532,496 A | 7/1996 | Gaston |
| 5,701,014 A | 12/1997 | Berger et al. |
| 5,792,581 A | 8/1998 | Ohnuma |
| 5,798,196 A | 8/1998 | Okino |
| 5,808,310 A | 9/1998 | Yamashita et al. |
| 5,825,040 A | 10/1998 | Marrian et al. |
| 5,847,959 A | 12/1998 | Veneklasen et al. |
| 5,888,682 A | 3/1999 | Nakasuji |
| 5,986,765 A | 11/1999 | Nakasuji |
| 5,994,009 A | 11/1999 | Tzu et al. |
| 6,017,658 A | 1/2000 | Rhee et al. |
| 6,087,048 A | 7/2000 | Suzaki et al. |
| 6,110,395 A | 8/2000 | Gibson, Jr. |
| 6,126,323 A | 10/2000 | Tange |
| 6,143,129 A | 11/2000 | Savas et al. |
| 6,162,323 A | 12/2000 | Koshimitzu |
| 6,361,911 B1 | 3/2002 | Tsai et al. |
| 6,373,071 B1 | 4/2002 | Innes et al. |
| 6,126,323 C1 | 9/2002 | Tange |
| 6,501,083 B1 | 12/2002 | Kamijo |
| 6,521,010 B1 | 2/2003 | Katata |
| 6,528,934 B1 | 3/2003 | Chen et al. |
| 6,531,069 B1 | 3/2003 | Srivastava et al. |
| 6,551,447 B1 | 4/2003 | Savas et al. |
| 6,590,344 B2 | 7/2003 | Tao et al. |
| 6,596,444 B2 | 7/2003 | Buck |
| 6,642,530 B2 | 11/2003 | DeLaRosa |
| 6,673,199 B1 | 1/2004 | Yamartino et al. |
| 6,692,575 B1 | 2/2004 | Omstead et al. |
| 6,828,573 B1 | 12/2004 | Kawano et al. |
| 6,872,507 B2 | 3/2005 | Tzu et al. |
| 7,202,169 B2 | 4/2007 | Chen et al. |
| 7,670,731 B2 * | 3/2010 | Finders et al. .................. 430/30 |
| 2001/0027843 A1 | 10/2001 | Komino et al. |

(Continued)

FOREIGN PATENT DOCUMENTS

WO  WO-2006/030895  3/2006

OTHER PUBLICATIONS

US Patent and Trademark Office, Office Action dated Oct. 13, 2009, U.S. Appl. No. 11/624,838, 14 pages.

(Continued)

Primary Examiner — Christopher Young
(74) Attorney, Agent, or Firm — Haynes and Boone, LLP

(57) ABSTRACT

A lithography method is disclosed. An exemplary lithography method includes providing an energy sensitive resist material on a substrate; providing a desired pattern; performing a lithography process on the substrate, wherein the lithography process includes exposing the energy sensitive resist material to a charged particle beam, such that the desired pattern is transferred to the energy sensitive resist material; and directing the charged particle beam from an off state to a defocus state, wherein the defocus state compensates for the backscattered energy, thereby reducing proximity effects.

20 Claims, 21 Drawing Sheets

U.S. PATENT DOCUMENTS

| | | |
|---|---|---|
| 2002/0005252 A1 | 1/2002 | Masuda et al. |
| 2002/0114897 A1 | 8/2002 | Sumiya et al. |
| 2003/0094903 A1 | 5/2003 | Tao et al. |
| 2003/0155079 A1 | 8/2003 | Bailey, III et al. |
| 2003/0168588 A1 | 9/2003 | Brailove et al. |
| 2004/0099213 A1 | 5/2004 | Adomaitis et al. |
| 2004/0103844 A1 | 6/2004 | Chou et al. |
| 2004/0149389 A1 | 8/2004 | Fink |
| 2006/0102286 A1 | 5/2006 | Kim |
| 2007/0286967 A1 | 12/2007 | Ide et al. |
| 2008/0099439 A1 | 5/2008 | Chang et al. |
| 2008/0100214 A1 | 5/2008 | Chang et al. |
| 2008/0102538 A1 | 5/2008 | Chang et al. |

OTHER PUBLICATIONS

S. Wolf, et al., Silicon Processing for the VLSI Era—vol. 1—Process Technology, Second Edition, pp. 665-718.

* cited by examiner

US 8,178,280 B2

SELF-CONTAINED PROXIMITY EFFECT CORRECTION INSPIRATION FOR ADVANCED LITHOGRAPHY (SPECIAL)

CROSS-RELATED APPLICATIONS

This application is related to the following U.S. patent applications: U.S. application Ser. No. 11/553,590 filed Oct. 27, 2006; U.S. application Ser. No. 11/624,838, filed Jan. 19, 2007; and U.S. application Ser. No. 11/624,857, filed Jan. 19, 2007, which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

SUMMARY

The present disclosure provides for many different embodiments. An exemplary lithography method includes providing an energy sensitive resist material on a substrate; providing a desired pattern; performing a lithography process on the substrate, wherein the lithography process includes exposing the energy sensitive resist material to a charged particle beam, such that the desired pattern is transferred to the energy sensitive resist material; and directing the charged particle beam from an off state to a defocus state, wherein the defocus state compensates for the backscattered energy, thereby reducing proximity effects.

Another exemplary lithography method comprises providing an energy sensitive resist material on a substrate; providing a desired pattern; performing a lithography process on the substrate, wherein the lithography process includes exposing the energy sensitive resist material to a charged particle beam, such that the desired pattern is transferred to the energy sensitive resist material; and tuning the charged particle beam to more than one state during the lithography process, wherein at least one state compensates for backscattered energy, thereby reducing proximity effects.

Yet another exemplary lithography method includes performing a lithography process on an energy sensitive material on a substrate that delineates a desired pattern on the energy sensitive material using a charged particle beam. The lithography process can include delineating the desired pattern on the energy sensitive material using the charged particle beam in an on state, wherein the charged particle beam passes through a main deflector, an aperture, and a projection lens system; directing the charged particle beam in the on state to an off state by deflecting the charged particle beam to the aperture, wherein the aperture prevents the charged particle beam from landing on the substrate; and directing the charged particle beam in the off state to a defocus state by passing the charged particle beam through the projection lens system.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
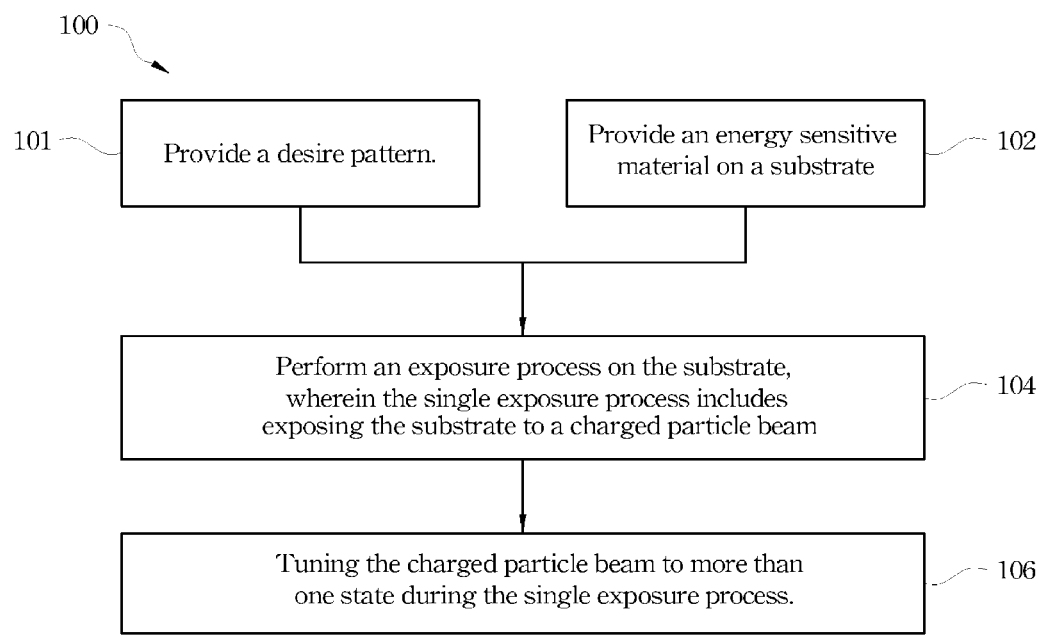
FIG. 1 is a flowchart of a method implemented by a lithography system according to aspects of the present disclosure.

The present disclosure relates generally to lithography methods and systems, and more particularly, to methods and systems that compensate for proximity effects arising from such lithography methods and systems.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a lithography system and method for use in manufacturing a semiconductor device (integrated circuit device). Lithography is a process that uses radiation to transfer a pattern (e.g., a geometric pattern) to an energy-sensitive layer (e.g., photoresist, or simply "resist") on a substrate (or thin film or material layer). The lithography process may utilize varying wavelengths of radiation to expose the energy-sensitive layer. Lithography processes include immersion lithography, photolithography, and optical lithography processes, which may transfer a pattern of a photomask (mask or reticle) to the light-sensitive layer utilizing ultraviolet (UV) radiation. Other types of lithography processes include X-ray lithography, which utilizes X-rays; ion beam lithography, which utilizes ion beams; and electron beam lithography, which utilizes electron beams.

The light/radiation causes a chemical change in exposed regions of the energy-sensitive layer, which may increase or decrease solubility of the exposed regions. If the exposed regions become more soluble, the energy-sensitive layer is referred to as a positive photoresist. If the exposed regions become less soluble, the energy-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the lithographic cycle a number of times.

FIG. 1 is a flow chart of one embodiment of a lithography method 100. In the present embodiment, the method 100 is a charged particle beam lithography method, such as an electron beam (e-beam) lithography method. E-beam lithography (EBL) utilizes a focused beam of electrons to expose the resist. No mask is used in e-beam lithography, and instead, a pattern is "written" directly into an energy-sensitive layer by a very fast scanning of electron beam. EBL can provide pattern transfer resolution below 100 nm, and it is commonly utilized for manufacturing high-resolution masks for photolithography and/or X-ray lithography. However, EBL resolution is limited by proximity effects, which are effects arising from scattering of electrons in the irradiated energy-sensitive layer. Such effects cause the size of the exposed energy-sensitive area to be larger than the diameter of the incident electron beam.

More particularly, in an incident e-beam's forward path through the energy-sensitive layer, energy is deposited in a diameter similar to the diameter of the incident e-beam (and may exhibit a somewhat greater diameter). This forward path energy is referred to as "forward scattered" energy. The energy of the incident e-beam is typically chosen to be sufficient for electrons to pass entirely through the exposed energy-sensitive layer to the underlying substrate (thin film or material layer). It has been observed that, disadvantageously, the incident electrons are scattered by atoms in the underlying substrate (thin film or material layer) so that a significant fraction of the incident electrons are "backscattered" into the energy-sensitive layer, producing an undesirable exposure. This energy deposited in the light-sensitive layer by the back scattered electrons is referred to as "backscattered energy." This extra, backscattered, exposure of the energy-sensitive layer to the backscattered energy/electrons is known as proximity effects, which reduce resolution.

Solutions for correcting proximity effects include dose correction and/or shape modification of the electron beam. Dose correction solutions for correcting proximity effects arising from EBL processes are disclosed in U.S. Pat. No. 4,463,265, entitled "Electron Beam Proximity Effect Correction by Reverse Field Pattern Exposure," and U.S. Pat. No. 5,254,438, entitled "Single Pass Compensation for Electron Beam Proximity Effect," both issued to Owen et al., which are both incorporated herein by reference in their entirety.

The proximity effect compensation method disclosed in U.S. Pat. No. 4,463,265 is often referred to as the "GHOST" method. The GHOST method utilizes at least two exposures: (1) a first circuit pattern exposure and (2) a second reverse field exposure, which exposes a working layer to a reverse field pattern to compensate for the backscattered energy. The two separate exposures required by the GHOST method present several disadvantages: (1) determining the reverse field pattern requires an extra data preparation step; (2) the second reverse field exposure reduces throughput; and (3) the second reverse field exposure introduces overlay error. The GHOST method also modifies beam current and dwell time to control the dose. Such beam current adjustment is related to e-beam tip conditions, including temperature and extraction voltage, which cannot provide real time modifications (particularly in nanosecond timing). It has also been observed that such dwell time modifications are not practical for advanced e-beam lithography equipment.

The proximity effect compensation method disclosed in U.S. Pat. No. 5,254,438 utilizes a single exposure process that requires calculating a dose correction scheme (also referred to as a pre-calculation dose correction method), in which the charge density of the electron beam is varied as the beam is scanned across the selected pattern. The selected pattern data is pre-processed before exposure in order to calculate the required dose variations. Thus, the pre-calculation dose correction method requires an extra off-line resource, which induces extra costs. Further, similar to the GHOST METHOD, the pre-calculation dose correction is utilized to modify/adjust either a beam current or dwell time, which is not practical for modern advances in e-beam lithography equipment.

Accordingly, the present disclosure introduces a single exposure scheme, which inserts a confine aperture (or confine aperture array) to control a defocused beam, for correcting proximity effects, referred to as "Self-Contained Proximity Effect Correction Inspiration for Advanced Lithography" or "SPECIAL." The method 100 illustrated in FIG. 1 implements the SPECIAL method. SPECIAL provides an improved method to compensate for the backscattered energy arising during e-beam lithography processes. SPECIAL can provide precise critical dimension control by exposing an energy-sensitive layer (patterning layer) to a reverse field pattern with defocused flux energy. This is accomplished in a single exposure process by "recycling" or "redirecting" an incident electron beam for writing the circuit pattern into an off (blank) state electron beam into a defocused electron beam (an electron beam that is in a negative or positive defocus state), thus almost instantaneously exposing the written circuit pattern to a reverse field pattern.

It has been observed that the SPECIAL method can improve throughput compared to the conventional GHOST method. Also, SPECIAL eliminates overlay problems associated with the conventional GHOST method since SPECIAL implements a single exposure scheme, which eliminates the need for aligning a first exposure pattern with a second exposure pattern as required by the GHOST method. It has further been observed that the SPECIAL method does not require a shape or dosage change of a main pattern (i.e., circuit pattern) as compared to the pre-calculation dose correction method described above, which requires an additional off-line pre-calculation of forward and backscattered energy to calculate a dosage correction scheme. SPECIAL can also be easily implemented into conventional lithography systems, requiring only minor hardware changes. Further, as noted above, the SPECIAL method utilizes a confine aperture (or confine aperture array) to control the defocused beam, which allows modification of the range intensity of an electron beam by changing a focal position, aperture size, and/or distance from a focal point. SPECIAL is not limited to the beam current and dwell time modifications of previous methods. It is understood that different embodiments may have different advantages, and that no particular advantage is necessarily required of any embodiment. It is further understood that additional steps can be provided before, during, and after the method 100, and some of the steps described below can be replaced or eliminated for additional embodiments of the method.

The method 100 is exemplary only and not intended to be limiting. At blocks 101 and 102, a desired pattern is provided, and an energy-sensitive material is provided over a substrate. The desired pattern will be transferred to the energy-sensitive material layer/substrate. The pattern can be in a bitmap based format, a vector-based format, other suitable format, or combinations thereof. The substrate is a wafer, a mask, or any base material, on which processing is conducted to produce new film or layers of material. In the present embodiment, the substrate is a semiconductor substrate including silicon. Alternatively, the semiconductor substrate could include an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. As another alternative, the substrate could include a non-semiconductor material, such as a glass substrate for thin-film-transistor liquid crystal display (TFT-LCD) devices, or fused quartz or calcium fluoride for a photomask (mask). The substrate can also include one or more material layers or patterning layers. As noted, in the present embodiment, the substrate includes an energy-sensitive layer formed thereover. The energy-sensitive layer is a photoresist layer (positive or negative), and could include an antireflective coating layer (e.g., top antireflective coating and/or bottom antireflective coating layers).

At blocks 104 and 106, an exposure process (for example, including a single exposure) is performed on the energy-sensitive material on the substrate, wherein the exposure process includes exposing the substrate to a charged particle beam and tuning the charged particle beam to more than one state (for example, from a first state to a second state). The exposure process transfers the desired pattern to the energy-sensitive material on the substrate. In the present embodiment, the charged particle beam is an electron beam. During the exposure process, the electron beam can be tuned to an "ON" state, an "OFF" state, a "POSITIVE DEFOCUS" state, and/or a "NEGATIVE DEFOCUS" state. More particularly, to compensate for proximity effects, the wafer is exposed to an electron beam in an "ON" state, which can then be turned into an "OFF" or "blank" state, which is then redirected into a defocused electron beam (i.e., a "POSITIVE DEFOCUS" or "NEGATIVE DEFOCUS" state). Alternatively, the electron beam could be deflected from the "ON" state onto a scattering membrane to cause a similar defocusing effect similar to the "POSITIVE DEFOCUS" or "NEGATIVE DEFOCUS" state. The "ON" state exposes the energy-sensitive material/substrate to an electron beam for transferring a circuit pattern, such as the desired pattern selected at block 101, and the defocused beam compensates for proximity effects resulting from the "ON" state transfer by exposing the energy-sensitive material/substrate to a defocused electron beam, which essentially exposes the energy-sensitive material/substrate to a reverse field pattern.

The method 100 can provide real-time control of a range and intensity of the reverse field exposure (i.e., defocused beam). The method 100 can further provide such range/intensity control without relying on beam current and/or dwell time modifications as required in conventional techniques. Essentially, a "blank" signal is switched into a "defocus" signal, almost instantaneously, without extra data preparation or a second exposure as required by the GHOST method described above. Further, the method 100 does not implement an off-line calculation for dosage correction as required by the pre-calculation dose correction method described above. The method 100 lacks the extra data preparation required by other proximity effect compensation methods. Also, the ability to tune the electron beam to various states in a single exposure process eliminates overlay problems arising from multiple exposures.

FIGS. 2A-2D, 3A-3F, and 5A-5D are simplified representations of e-beam lithography systems 200, 300, and 500 in various states that can be utilized to implement the method 100 according to aspects of the present disclosure. The e-beam lithography systems 200, 300, 500 include those systems known in the art and could alternatively include future e-beam lithography systems. The e-beam lithography systems 200, 300, 500 include one or more components and/or sub-systems, including but not limited to, an electron gun, electron gun alignment system, condenser lenses, beam blanking system, zoom lenses, stigmators, apertures, projection lenses, deflectors (for example, a main field deflection system and/or a sub-field deflection system), beam current detectors, backscattering electron detection system, vacuum system, high voltage power source, pattern generator, and/or other suitable components/systems. It is understood that additional features can be added in the e-beam lithography systems 200, 300, 500, and some of the features described below can be replaced or eliminated, for additional embodiments of the e-beam lithography systems 200, 300, 500.

FIGS. 2A-2D illustrate a simplified e-beam system 200 in various states that can implement the method 100. The e-beam system 200 includes a main deflector 202, an aperture (beam stop) 204, and lenses 206, 208, 210. The e-beam system 200 irradiates the surface of a wafer 220 with an electron beam 230. More particularly, the e-beam system 200 can implement the method 100 and, in real-time, expose the wafer 220 to the electron beam 230 in an "ON" state, "OFF" state, "POSITIVE DEFOCUS" state, and/or "NEGATIVE DEFOCUS" state. Tuning the electron beam 230 to various states provides the ability to expose the wafer 220 to a desired (e.g., circuit) pattern and compensate for backscattered energy by exposing the wafer 220 to a defocused electron beam (i.e., expose the wafer 220 to a reverse field pattern), for example, within a single exposure.

The main deflector 202 is a beam deflector consisting of electrostatic and/or magnetic components. Deflection of the electron beam 230 is used to scan the electron beam 230 across the surface of the wafer 220. The main deflector 202 can change a direction of the electron beam 230 with respect to an axis. For example, the main deflector 202 may include two pairs of coils or plates oriented perpendicular to each other, wherein one pair can provide beam deflection in the x-direction, and one pair can provide beam deflection in the y-direction.

The aperture (beam stop) 204 provides an opening through which the electron beam 230 can pass through. The aperture 204 can limit the angle of electron beam spread, which can improve resolution. The aperture 204 may include more than one aperture, which can allow modification of the opening through which the electron beam 230 passes through.

The lenses 206, 208, 210 are projection lenses. The projection lenses 206, 208, 210 can focus the electron beam 230 to form the final beam spot on the surface of the wafer 220. Though only lenses 206, 208, 210 are illustrated, it is understood that any number or combination of lenses (including lenses other than projection lenses) may be present to focus the electron beam 230 on the surface of the wafer 220. For example, in the present embodiment, the electron beam 230 is focused at a focal point 232a, landing on a focused spot 234a on the wafer 220. A graph 242a represents an energy distribution of focused spot 234a of the electron beam 230. The energy distribution is represented by an intensity and range of the focused spot 234a, where $I_F$ represents the intensity of the focused spot 234a, and $R_F$ represents the range of the focused spot 234a.

Figure 2A:
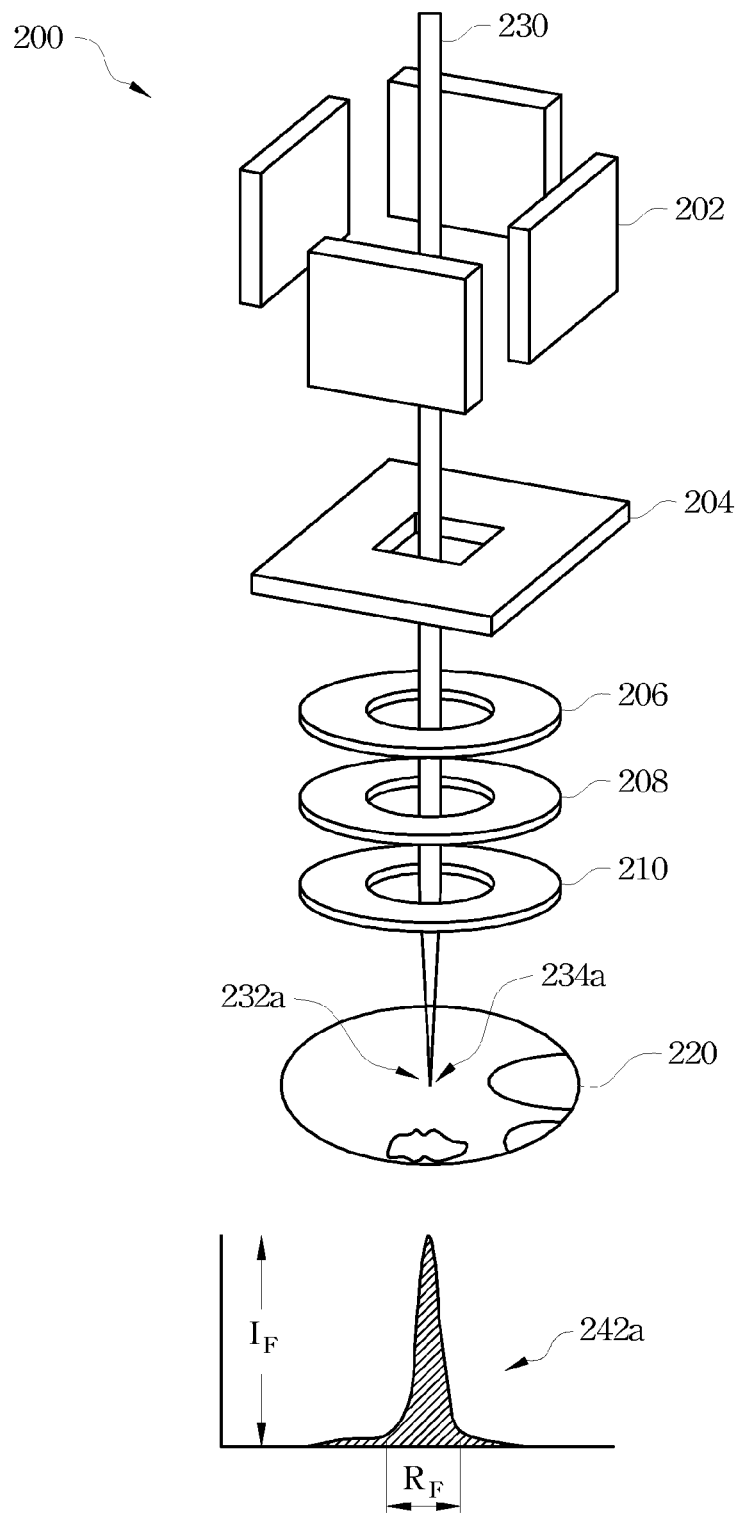
FIGS. 2A-2D are simplified representations of a lithography system according to aspects of the present disclosure.
Figure 2B:
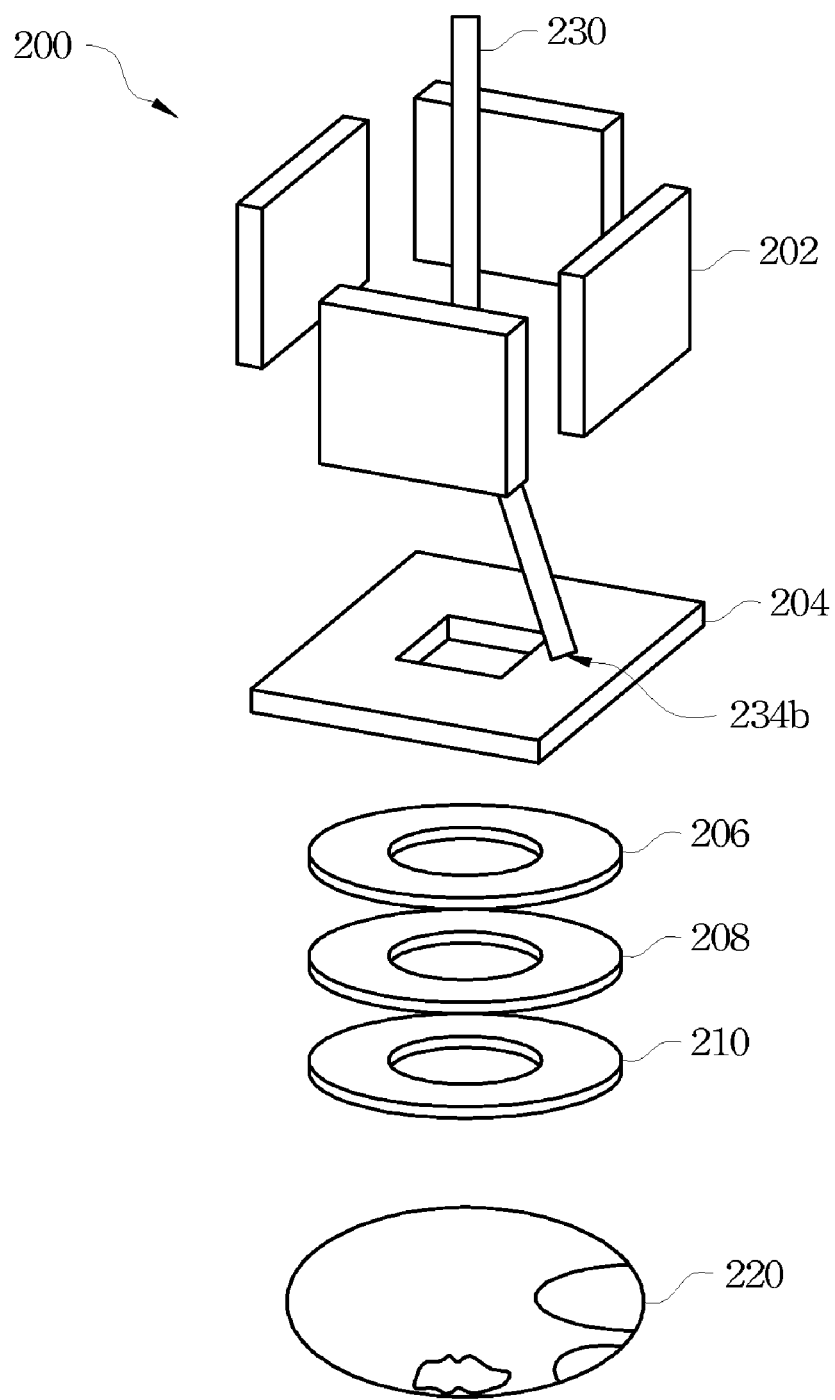

FIG. 2A illustrates the e-beam system 200 in the "ON" state ("BEAM ON AT PROPER FOCUS"), and FIG. 2B illustrates the e-beam system 200 in the "OFF" ("BEAM OFF") or "blank" state. In the "ON" state, the electron beam 230 travels through the entire system and lands on the wafer 220. In the "OFF" state, the electron beam 230 is deflected and blocked by beam stop 204. To turn the electron beam 230 off, a voltage is applied across the main deflector 202, which sweeps the electron beam 230 off axis until it is intercepted by the beam stop 204, landing on the beam stop 204 at spot 234b.

Figure 2C:
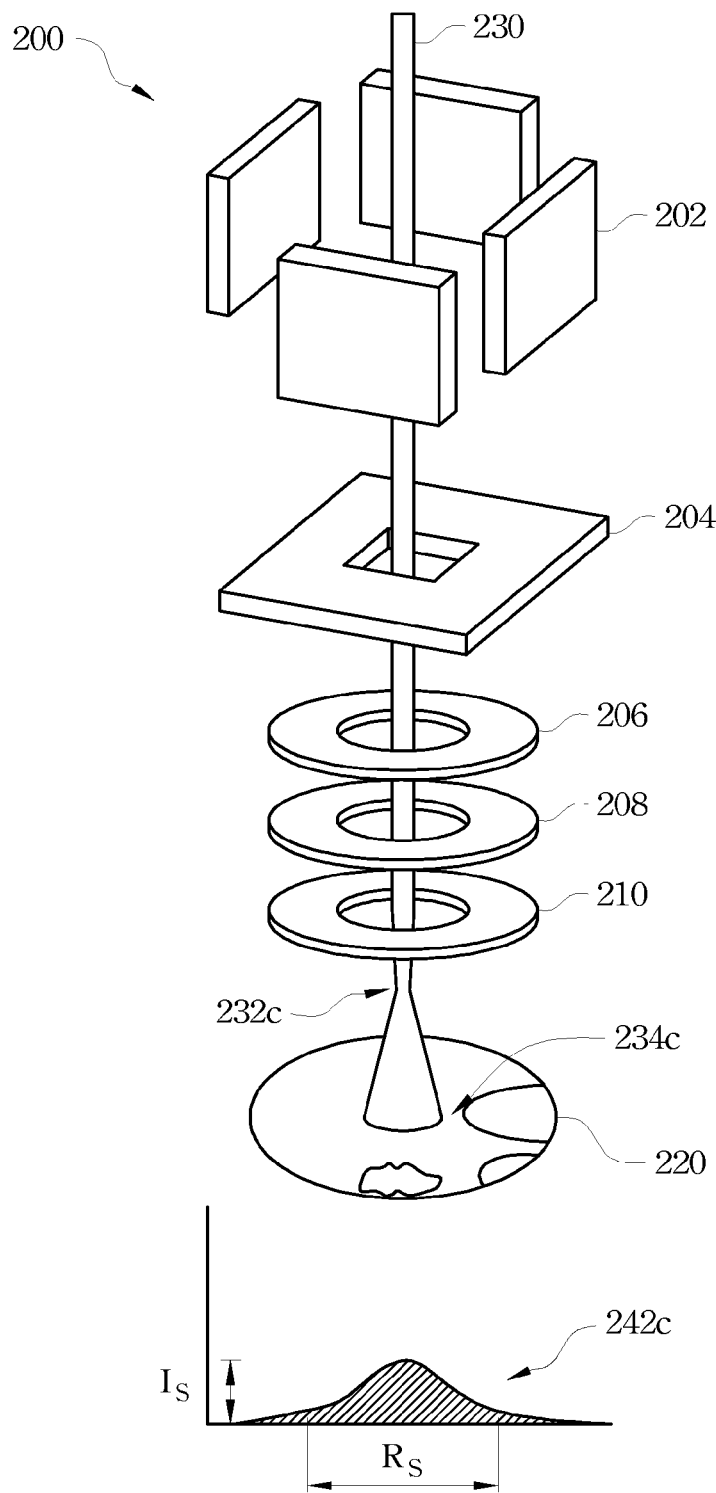
Figure 2D:
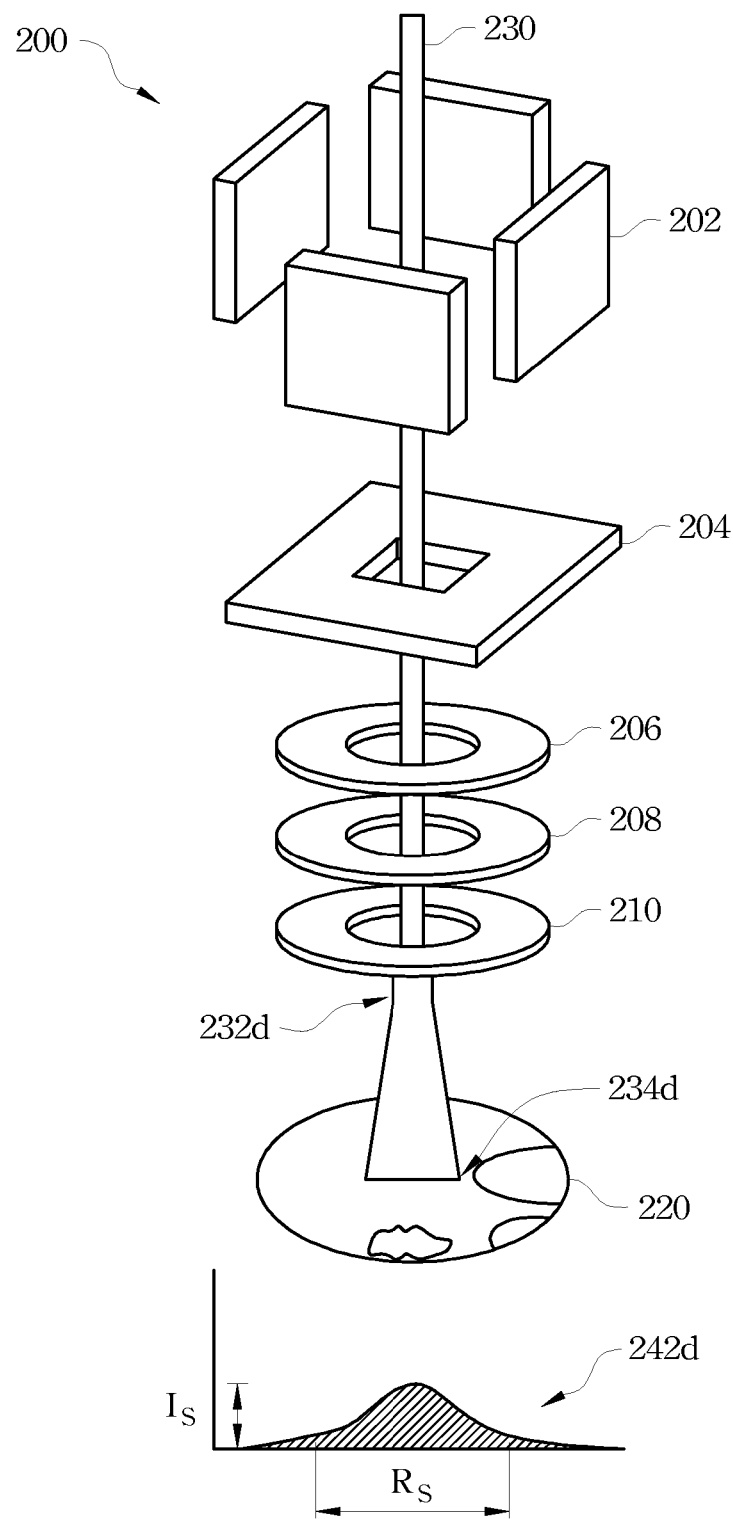

FIG. 2C illustrates the e-beam system 200 in a "POSITIVE DEFOCUS" ("BEAM ON AT POSITIVE DEFOCUS") state, and FIG. 2D illustrates the e-beam system 200 in a "NEGATIVE DEFOCUS" ("BEAM ON AT NEGATIVE DEFOCUS") state. In both the positive and negative defocus states, the electron beam 230 is defocused and lands on the wafer 220. The "positive defocus" state refers to when the focal point has been moved away from an optical element along an optical axis, and the "negative defocus" state refers to when the focal point has been moved towards an optical element along an optical axis. For example, in the present embodiment, referring to FIG. 2C, the focal point has moved away from an optical element (e.g., lens 210)(and indicated by focal point 232c), with the electron beam 230 landing on defocused spot 234c. Referring to FIG. 2C, the focal point has moved towards an optical element (e.g., lens 210)(and indicated by focal point 232d), with the electron beam 230 landing on defocused spot 234d. Achieving the positive defocus state of the electron beam 230 may utilize the projection lenses 206, 208, 210 for a stronger focus, and achieving the negative defocus state of the electron beam 214 may utilize the projection lenses 206, 208, 210 for a weaker focus. Graphs 242c and 242d represent an energy distribution of the defocused spots 234c, 234d of the electron beam 230. The energy distribution is represented by an intensity and range of the defocused spots 234c, 234d, where $I_S$ represents the intensity of the defocused spots 234c, 234d, and $R_S$ represents the range of the defocused spots 234c, 234d.

FIGS. 3A-3F illustrate a simplified e-beam system 300 in various states that can implement the method 100. The e-beam system 300, similar to e-beam system 200, includes a main deflector 302, an aperture (beam stop) 304 (also referred to as a first aperture), and lenses 306, 308, 310. The main deflector 302, aperture 304, and lenses 306, 308, 310 are similar to the main deflector 202, aperture 204, and lenses 206, 208, 210 described above. The e-beam system 300 irradiates the surface of a wafer 320 with an electron beam 330. More particularly, the e-beam system 300 can implement the method 100 and, in real-time, expose the wafer 320 to the electron beam 330 in an "ON" state, "OFF" state, "POSITIVE DEFOCUS" state, and/or "NEGATIVE DEFOCUS" state. Tuning the electron beam 330 to various states provides the ability to expose the wafer 320 to a desired (e.g., circuit) pattern and compensate for backscattered energy by exposing the wafer 320 to a defocused electron beam (i.e., expose the wafer 320 to a reverse field pattern), for example, within a single exposure. As will be further discussed below, the e-beam system 300 can include a range control aperture 312.

The range control aperture 312 (also referred to as a second aperture) can provide the tuning of the electron beam 330 to the various states.

Figure 3A:
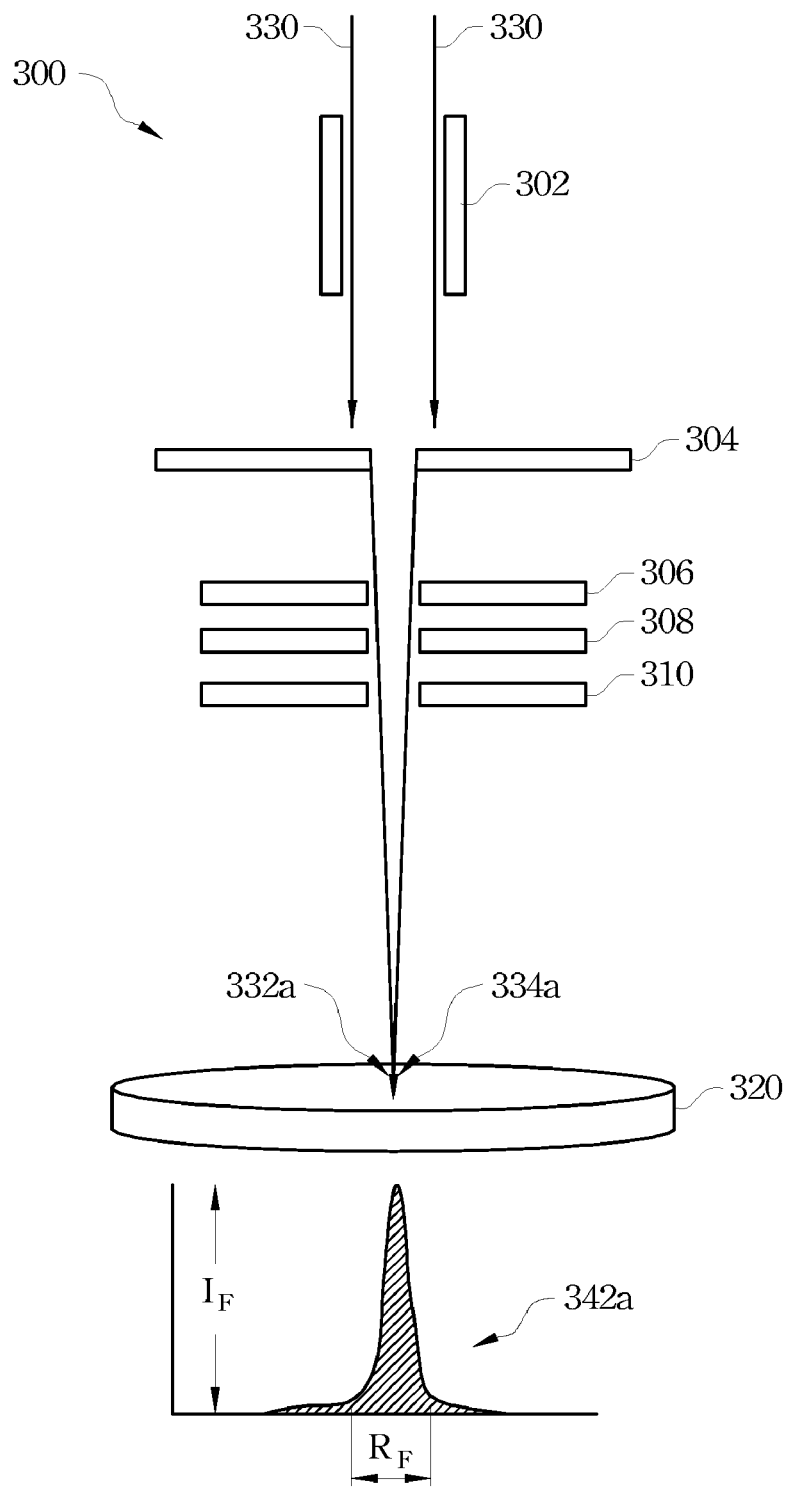
FIGS. 3A-3F are simplified representations of a lithography system according to aspects of the present disclosure.

FIG. 3A illustrates the e-beam system 300 in the "ON" state, where the electron beam 330 travels through the entire system 300 and lands on the wafer 320, without the range control aperture. The electron beam 330 is focused at a focal point 332a, landing on a focused spot 334a on the wafer 320. A graph 342a represents an energy distribution of focused spot 334a of the electron beam 330. The energy distribution is represented by an intensity and range of the focused spot 334a, where $I_F$ represents the intensity of the focused spot 334a, and $R_F$ represents the range of the focused spot 334a. This involves tuning the projection lenses 304, 306, 308 to a best focus voltage, such that the electron beam 330 can be focused to a minimum spot on the wafer 320.

Figure 3B:
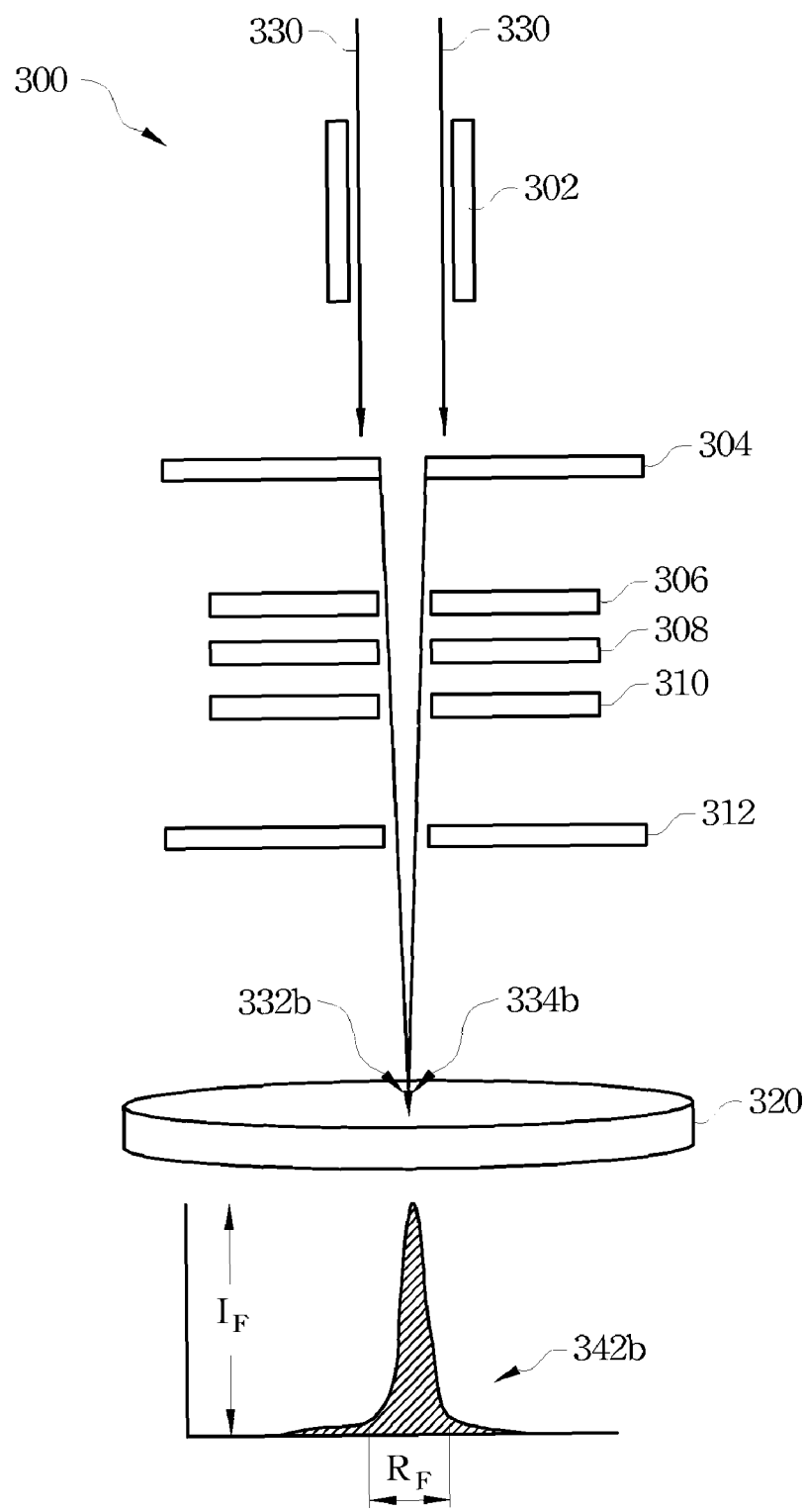

FIG. 3B illustrates the e-beam system 300 in the "ON" state, where the electron beam 330 travels through the entire system 300, including through the range control aperture 312, and lands on the wafer 320. The electron beam 330 is focused at a focal point 332b, landing on a focused spot 334b on the wafer 320. A graph 342b represents an energy distribution of focused spot 334b of the electron beam 330. The energy distribution is represented by an intensity and range of the focused spot 334a, where $I_F$ represents the intensity of the focused spot 334a, and $R_F$ represents the range of the focused spot 334a. This involves tuning the range control aperture 312 and projection lenses 304, 306, 308 to a best focus voltage, such that the electron beam 330 can be focused to a minimum spot on the wafer 320.

Figure 3C:
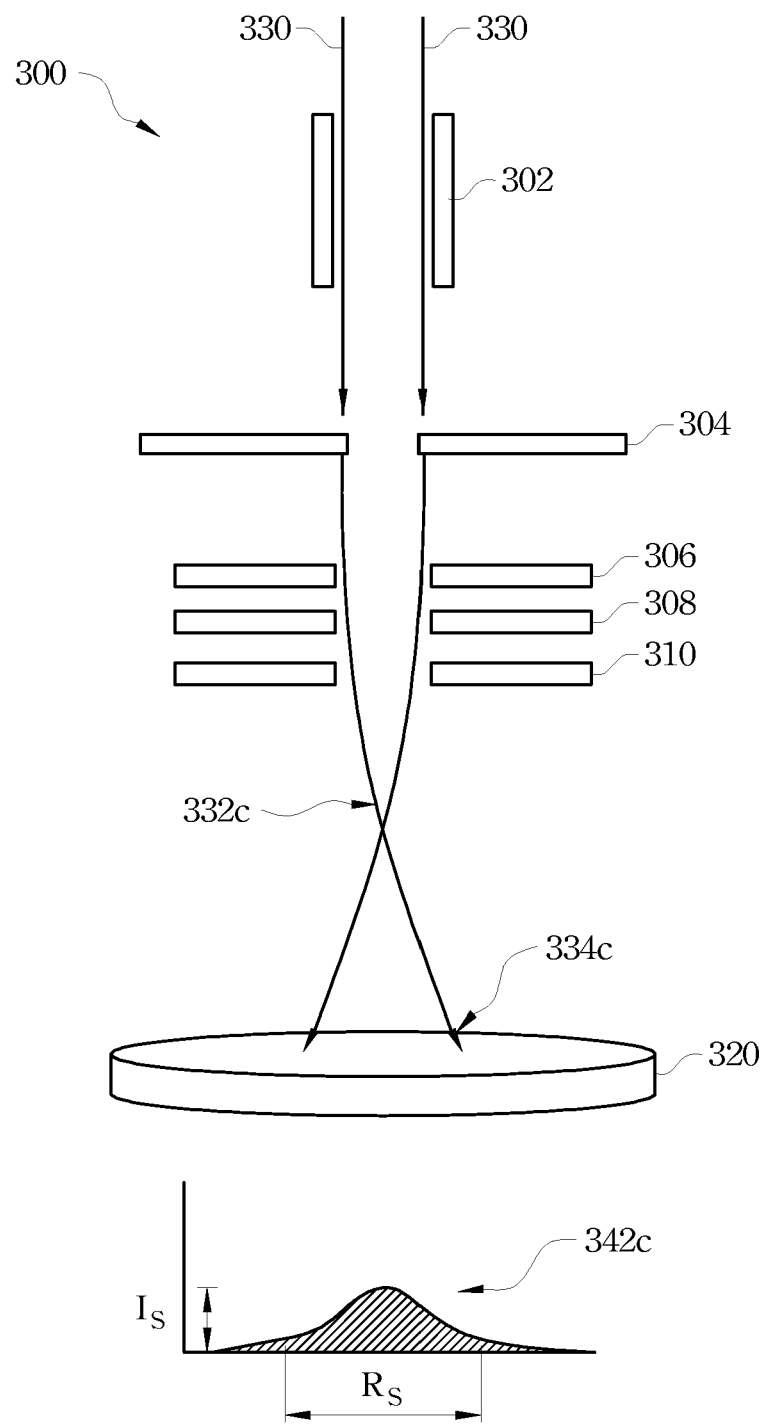

FIG. 3C illustrates the e-beam system 300 in the "POSITIVE DEFOCUS" state, where the electron beam 330 travels through the entire system 300 and lands on the wafer 320, without the range control aperture. The electron beam 330 is defocused, with a focal point 332c, landing on a defocused spot 334c on the wafer 320. A graph 342c represents an energy distribution of defocused spot 334c. The energy distribution is represented by an intensity and range of the defocused spot 334c, where $I_S$ represents the intensity of the defocused spot 334c, and $R_S$ represents the range of the defocused spot 334c.

Figure 3D:
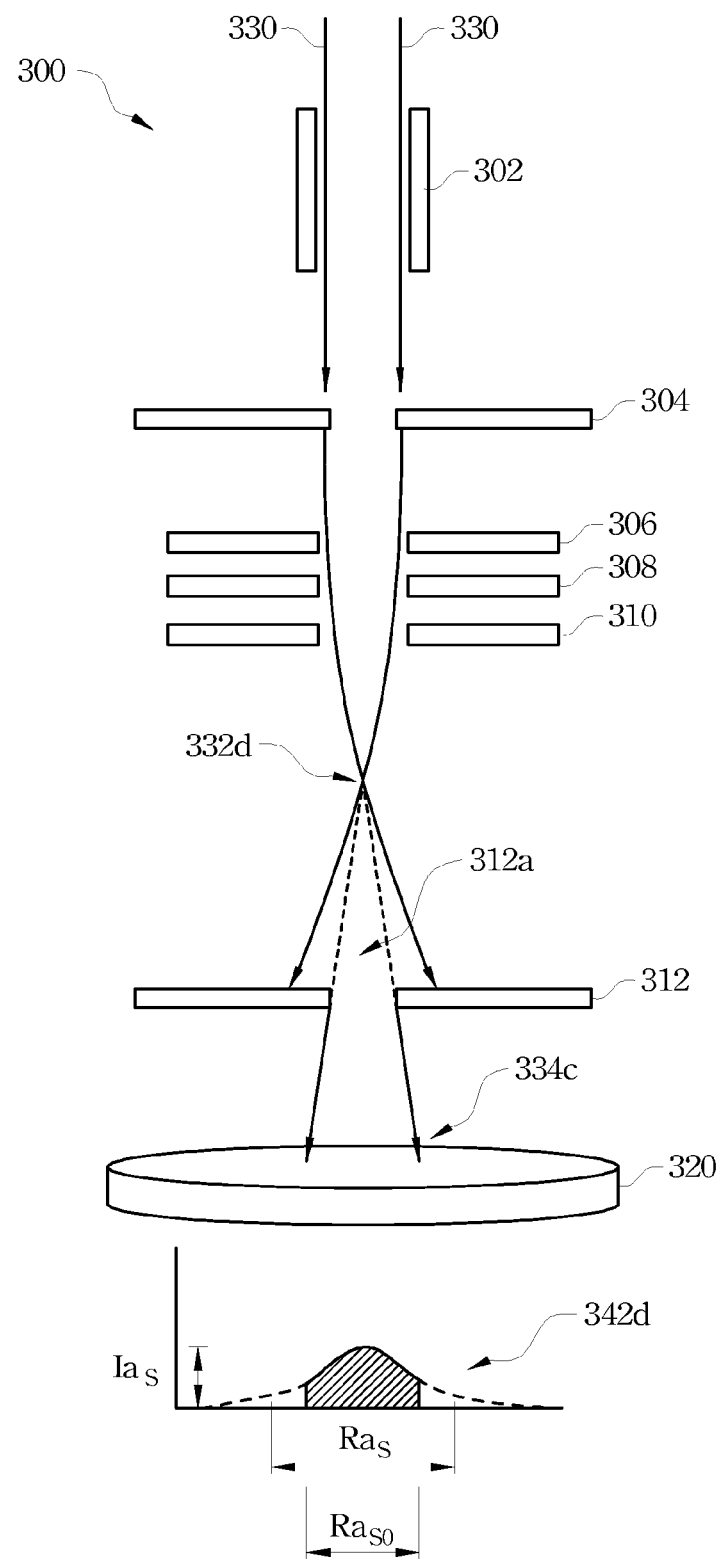

FIG. 3D illustrates the e-beam system 300 in the "POSITIVE DEFOCUS" state, where the electron beam 330 travels through the entire system 300, including the range control aperture 312, and lands on the wafer 320. This involves tuning the range control aperture 312 and projection lenses 304, 306, 308 to a weaker focus voltage. The electron beam 330 is defocused, with a focal point 332d, landing on a defocused spot 334d on the wafer 320. A graph 342d represents an energy distribution of defocused spot 334d of the electron beam 330, which is confined by the opening 312a of the range control aperture 312. Accordingly, the energy distribution is represented by an intensity and range of the defocused spot 334d. $Ia_S$ represents the peak of intensity of the defocused spot 334d, which is the same as the intensity $I_S$ of the defocused spot 332c in FIG. 3C; and $Ra_S$ represents the range of the defocused spot 334d, which is smaller than the range $R_S$ of the defocused spot without the range control/confining aperture 312.

Figure 3E:
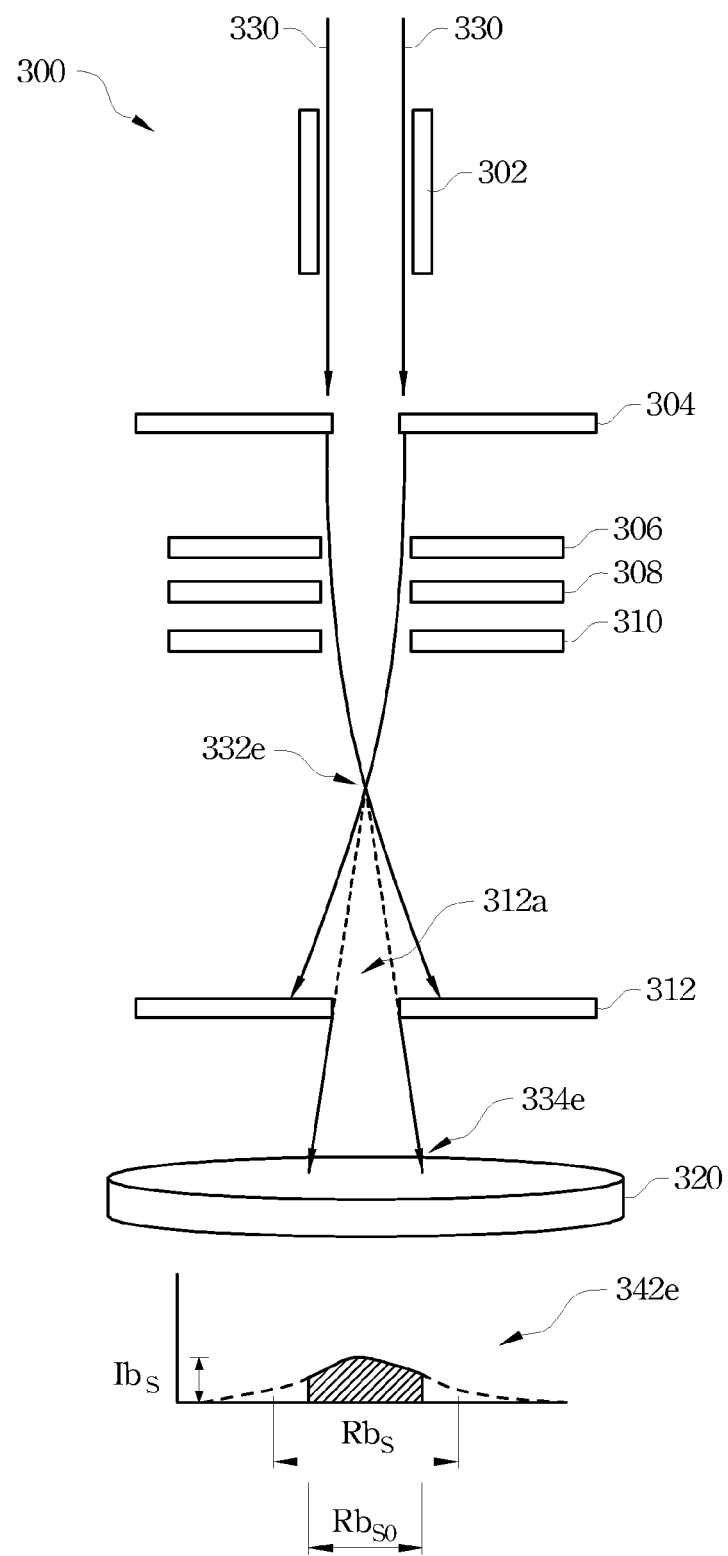

FIG. 3E illustrates the e-beam system 300 in a stronger "POSITIVE DEFOCUS" state, where the electron beam 330 travels through the entire system 300, including the range control aperture 312, and lands on the wafer 320. This involves tuning the range control aperture 312 and projection lenses 304, 306, 308 to a stronger focus voltage to make a focal point 332e farther away from the wafer 320 (as compared with the focal point 332d in FIG. 3D). The electron beam 330 is defocused, with the focal point 332e, landing on a defocused spot 334e on the wafer 320. A graph 342e represents an energy distribution of defocused spot 334e of the electron beam 330, which is confined by the opening 312a of the range control aperture 312. Accordingly, the energy distribution is represented by an intensity and range of the defocused spot 334e. $Ib_S$ represents the peak of intensity of the defocused spot 334e, which is smaller than the intensity $Ia_S$ of the defocused spot 332d in FIG. 3D; and $Rb_S$ represents the range of the defocused spot 334e, which is approximately the same size as the range $Ra_S$ of the defocused spot 332d in FIG. 3D.

Figure 3F:
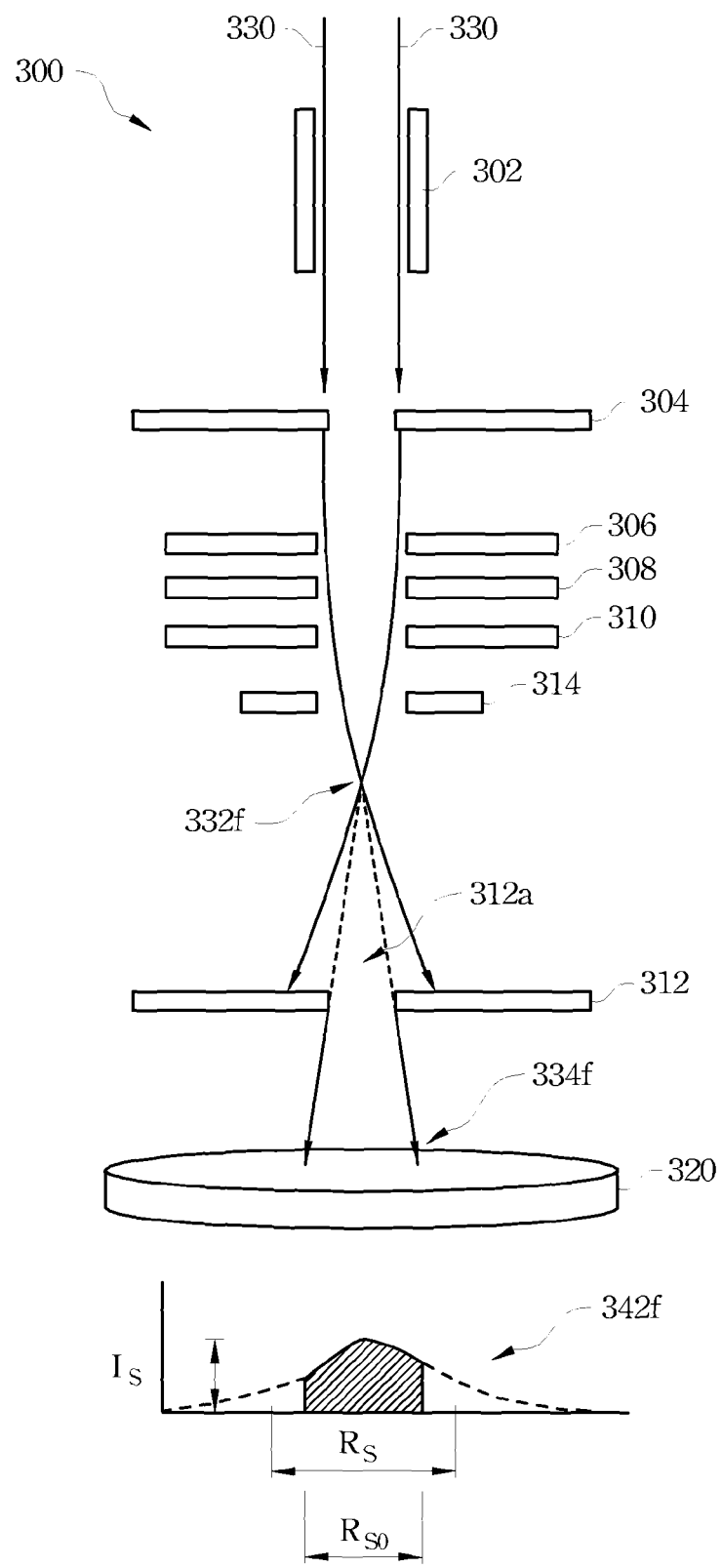

FIG. 3F illustrates the e-beam system 300 in a stronger "POSITIVE DEFOCUS" state, where the electron beam 330 travels through the entire system 300, including the range control aperture 312, and lands on the wafer 320. In the present embodiment, a plate/lens 314 is inserted between the projection lens system (lenses 304, 306, 308) and the range control/confining aperture 312. This extra plate/lens 314 provides the capability of defocusing the electron beam 330, such that it is not necessary to change a driving voltate of the projection lens system (which can often necessitate very precise control). The electron beam 330 is defocused, with the focal point 332f, landing on a defocused spot 334f on the wafer 320. A graph 342f represents an energy distribution of defocused spot 334f of the electron beam 330, which is confined by the opening 312a of the range control aperture 312. Accordingly, the energy distribution is represented by an intensity and range of the defocused spot 334f. $Ic_S$ represents the peak of intensity of the defocused spot 334f; and $Rc_S$ represents the range of the defocused spot 334f.

Referring to FIGS. 3A-3F, the range control aperture 312 is utilized to modify, almost instantly (i.e., in real-time), a state of the electron beam 330. For example, the electron beam 330 is in a first state when the e-beam system 300 is in the "ON" state as illustrated in FIG. 3A, in a second state when the e-beam system 300 is in the "POSITIVE DEFOCUS" state, and in a third state when the e-beam system 300 is in the "NEGATIVE DEFOCUS" state. The range control aperture 312 allows modification of adjustment of a state of the electron beam 330, and thus, the electron beam exposure of the wafer 320.

Figure 4A:
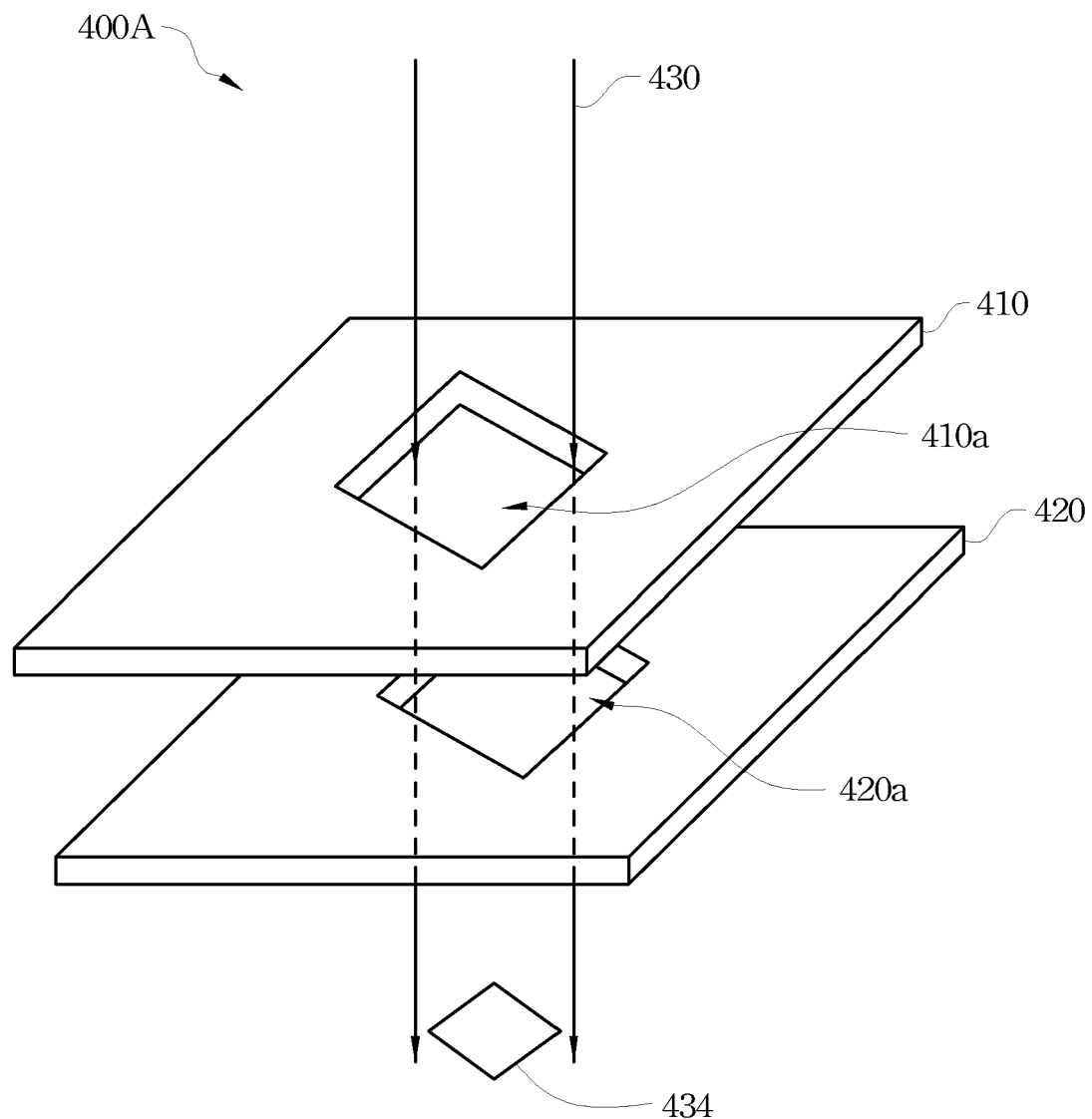
FIGS. 4A-4B are simplified representations of range control apertures utilized within a lithography system according to aspects of the present disclosure.
Figure 4B:
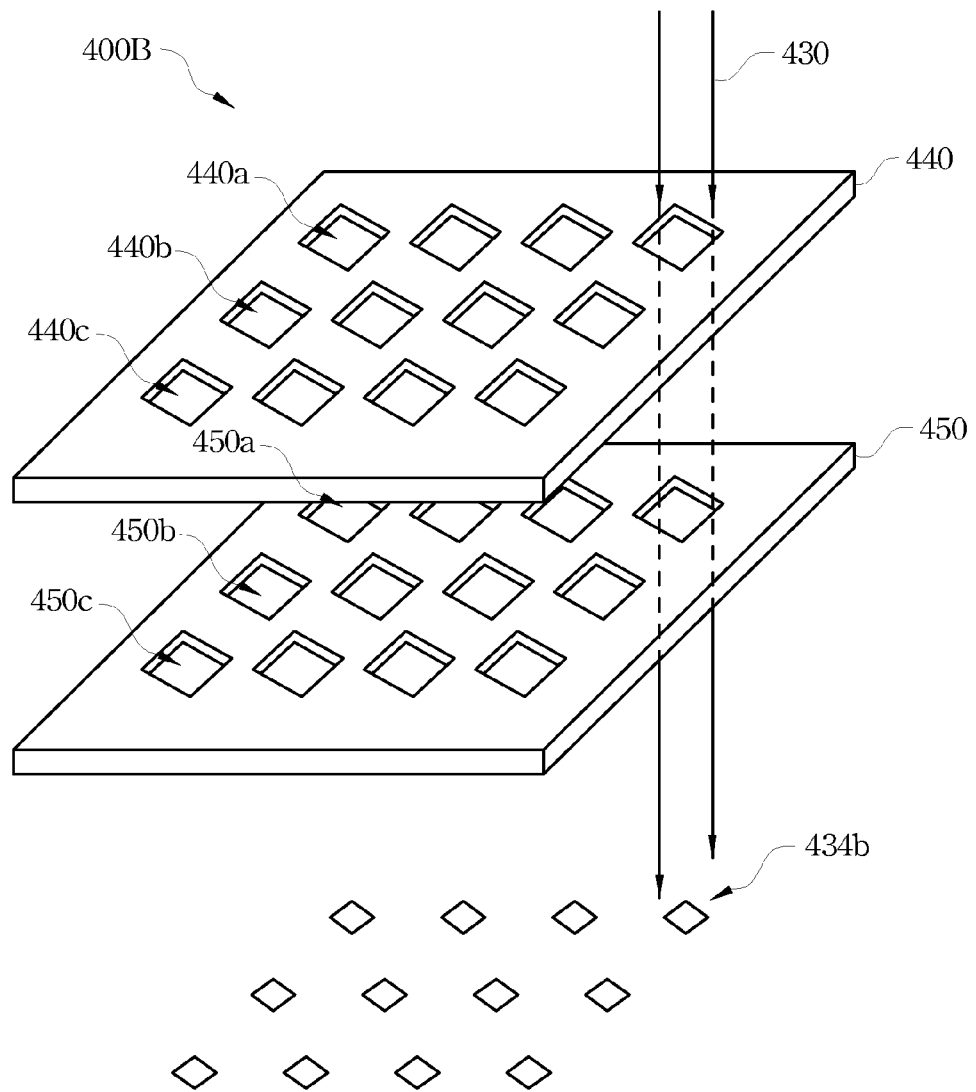

The range control aperture 312 is any suitable range control aperture. FIGS. 4A and 4B provide exemplary range control apertures. For example, referring to FIG. 4A, the range control aperture 312 could be similar to range control aperture 400A, which includes plates 410 and 420. The range control aperture 400A includes a single aperture/opening, which is defined by overlapping of opening 410a of plate 410 and opening 420a of plate 420, such that an electron beam 430 travels through the aperture/opening to form spot 434. Alternatively, referring to FIG. 4B, the range control aperture 312 could be similar to a range control aperture 400B, which includes aperture array plates 440 and 450. The range control aperture 400B includes an aperture array of openings, which are defined by overlapping numerous openings 440a, 440b, 440c, ... 440N and numerous openings 450a, 450b, 450c, . . ., 450N, such that the electron beam 430 travels through the aperture/opening to form spot 434b. Also, the range control aperture 312 could alternatively include apertures such as those described in U.S. patent application Ser. No. 11/553,590 (Attorney Docket No. 24061.761/2006-0087), filed Oct. 27, 2006, entitled "Apparatus and Method for Regional Plasma Control," which is incorporated herein by reference in its entirety. It is understood that the range control aperture 312 may include a single range control aperture or multiple range control apertures to modify or tune the state of the electron beam 330 that lands on the wafer 320.

Alternatively to FIGS. 3A-3F, an e-beam system can implement scattering to achieve a defocusing effect, and thus, expose the wafer to a reverse field pattern for compensating for backscattered energy. For example, FIGS. 5A-5D illustrate a simplified e-beam system 500 in various states that utilizes a scattering aperture to implement the method 100. The e-beam system 500 can implement the method 100 utilizing a scattering aperture and, in real-time, expose the wafer 520 to the electron beam 530 in an "ON" state, "OFF" state, "POSITIVE DEFOCUS" state, and/or "NEGATIVE DEFOCUS" state. Tuning the electron beam 530 to various states provides the ability to expose the wafer 520 to a desired (e.g., circuit) pattern and compensate for backscattered energy by exposing the wafer 520 to a defocused electron beam (i.e., expose the wafer 520 to a reverse field pattern), for example, within a single exposure.

Similarly to the e-beam systems 200 and 300, the e-beam system 500 includes a main deflector 502 and lenses 506, 508, 510. The main deflector 502 and lenses 506, 508, 510 are similar to the main deflectors 202, 302 and lenses 206, 306, 208, 308, 210, 310 described above. Some of embodiments of the e-beam system 500 also include a lens 503 (similar to lenses 506, 508, 510) and/or additional deflector 502a (which can be similar to deflector 502). The e-beam system 500 irradiates the surface of a wafer 520 with an electron beam 530. The e-beam system 500 also includes an aperture (beam stop) 512 (also referred to as a second aperture), which may be similar to the range control aperture 312, 400A, 400B described above. Similar to the systems 200 and 300 described above, graphs 542a, 542b, 542c, and 542d represent an energy distribution of the electron beam 530 in each configuration.

Figure 5A:
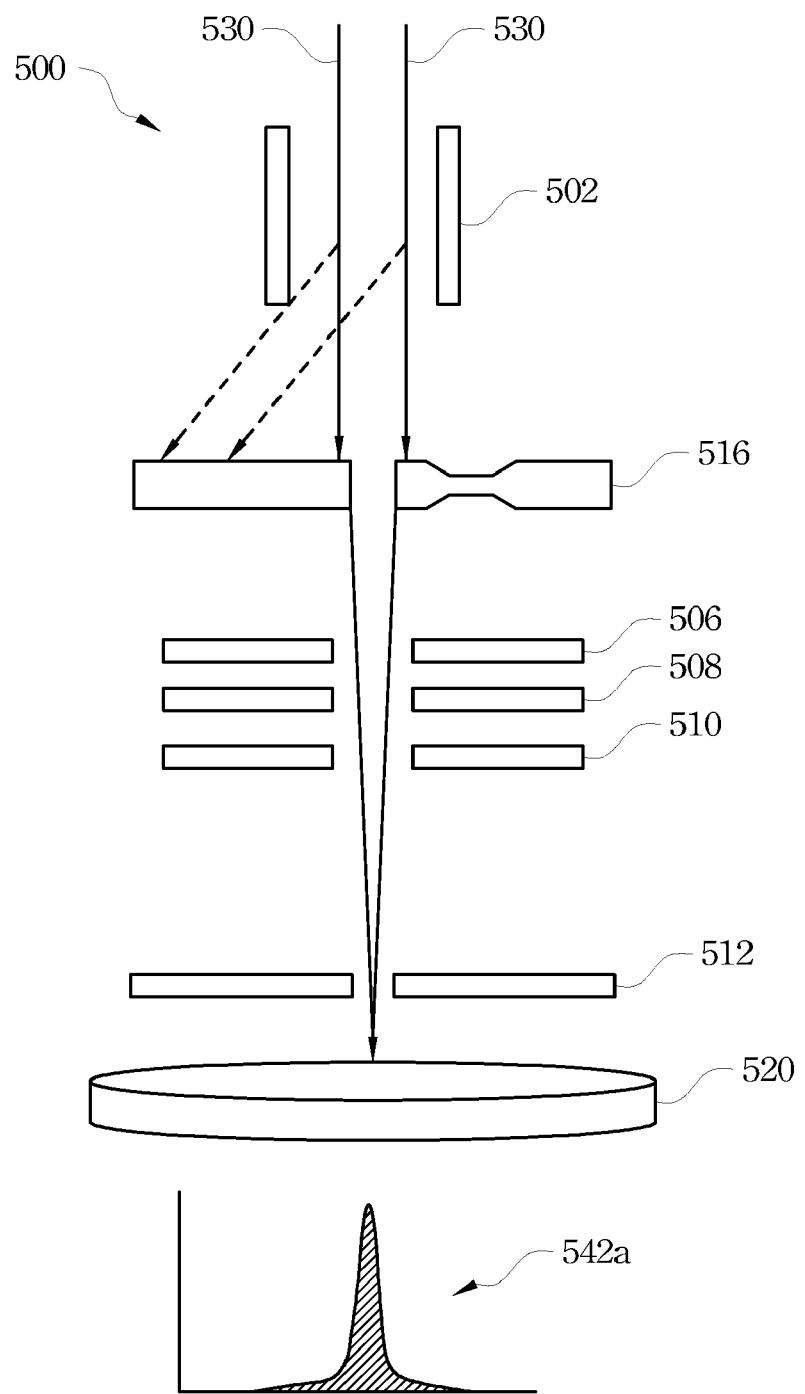
FIGS. 5A-5D are simplified representations of a lithography system according to aspects of the present disclosure.
Figure 5B:
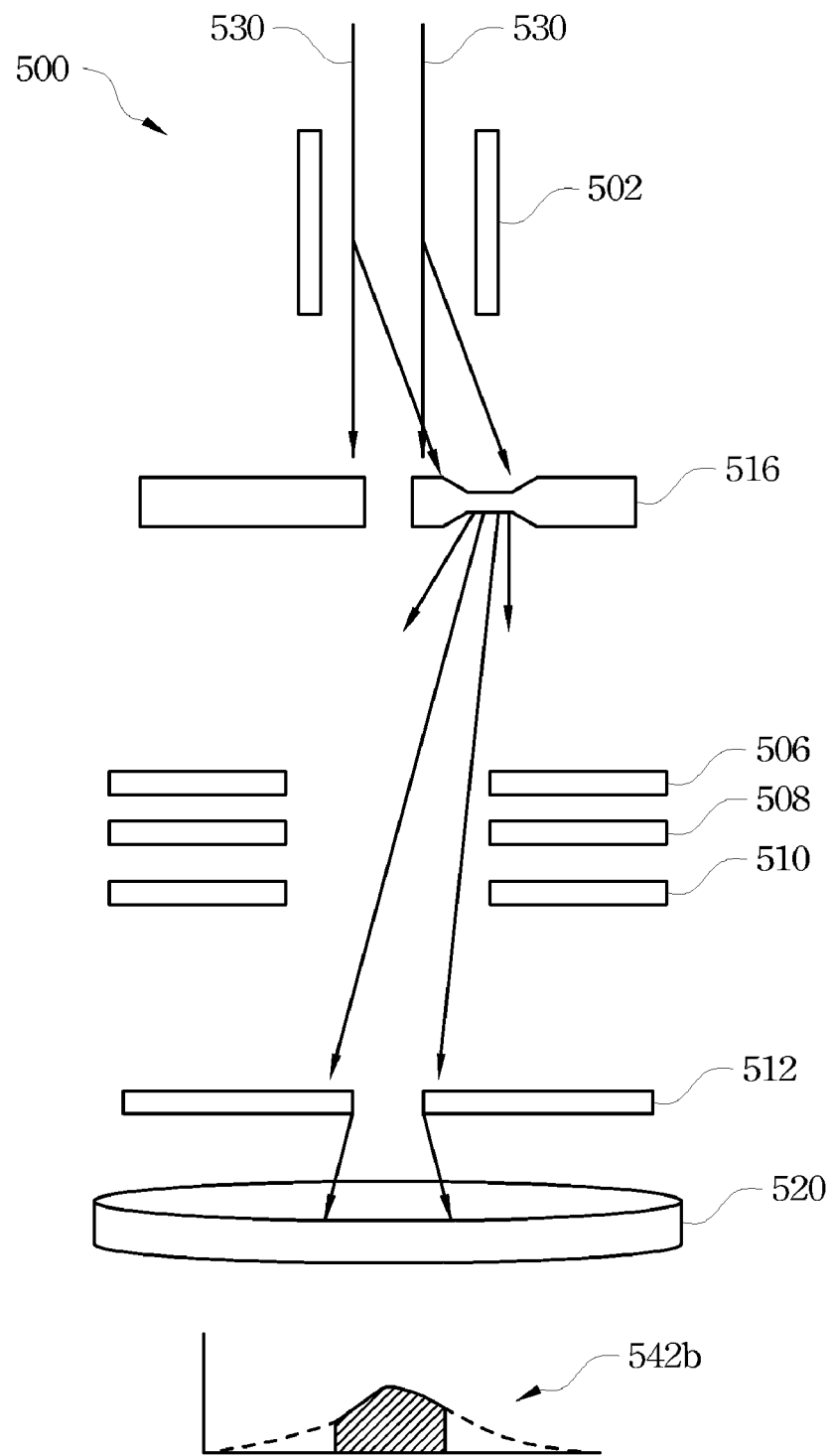
Figure 5C:
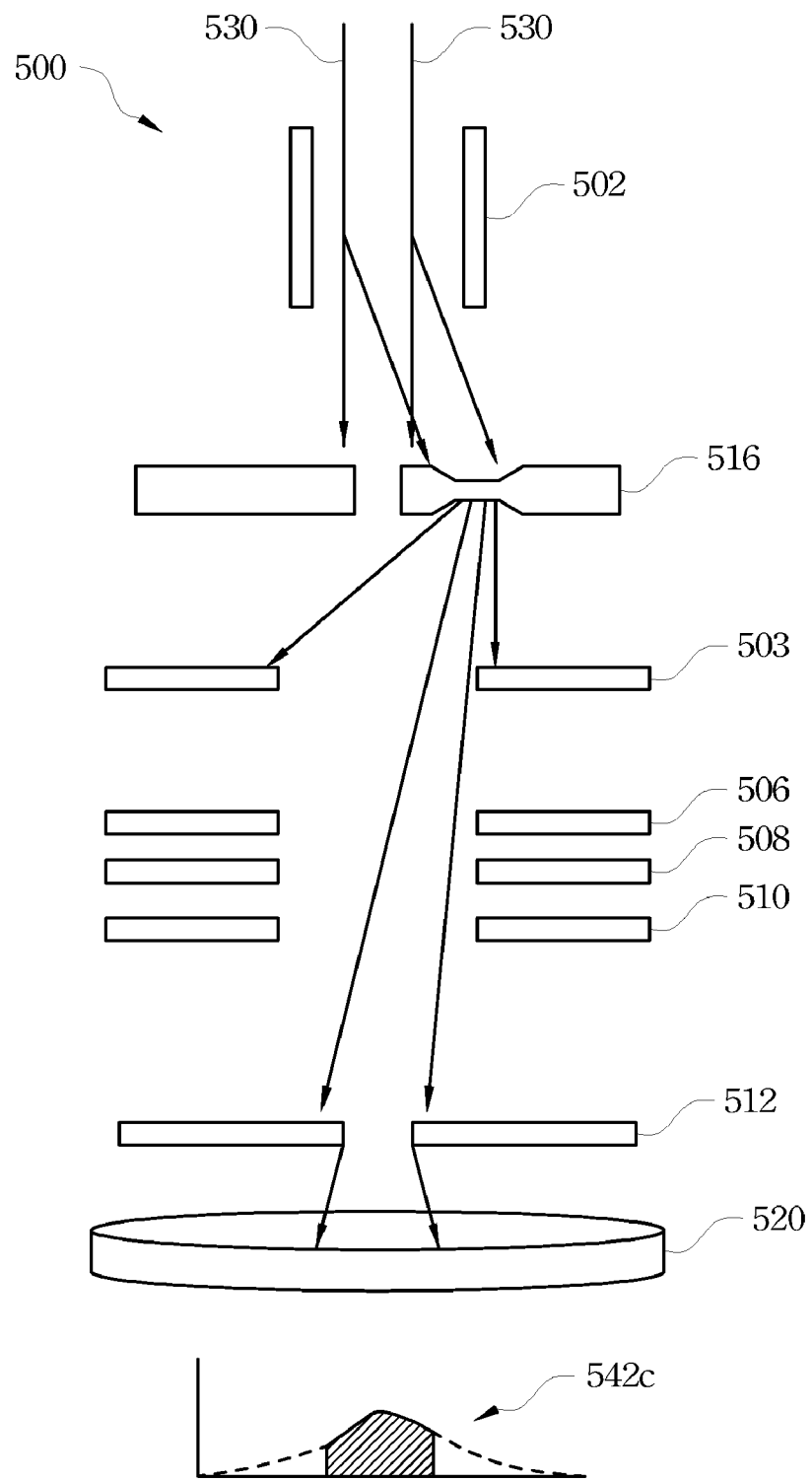
Figure 5D:
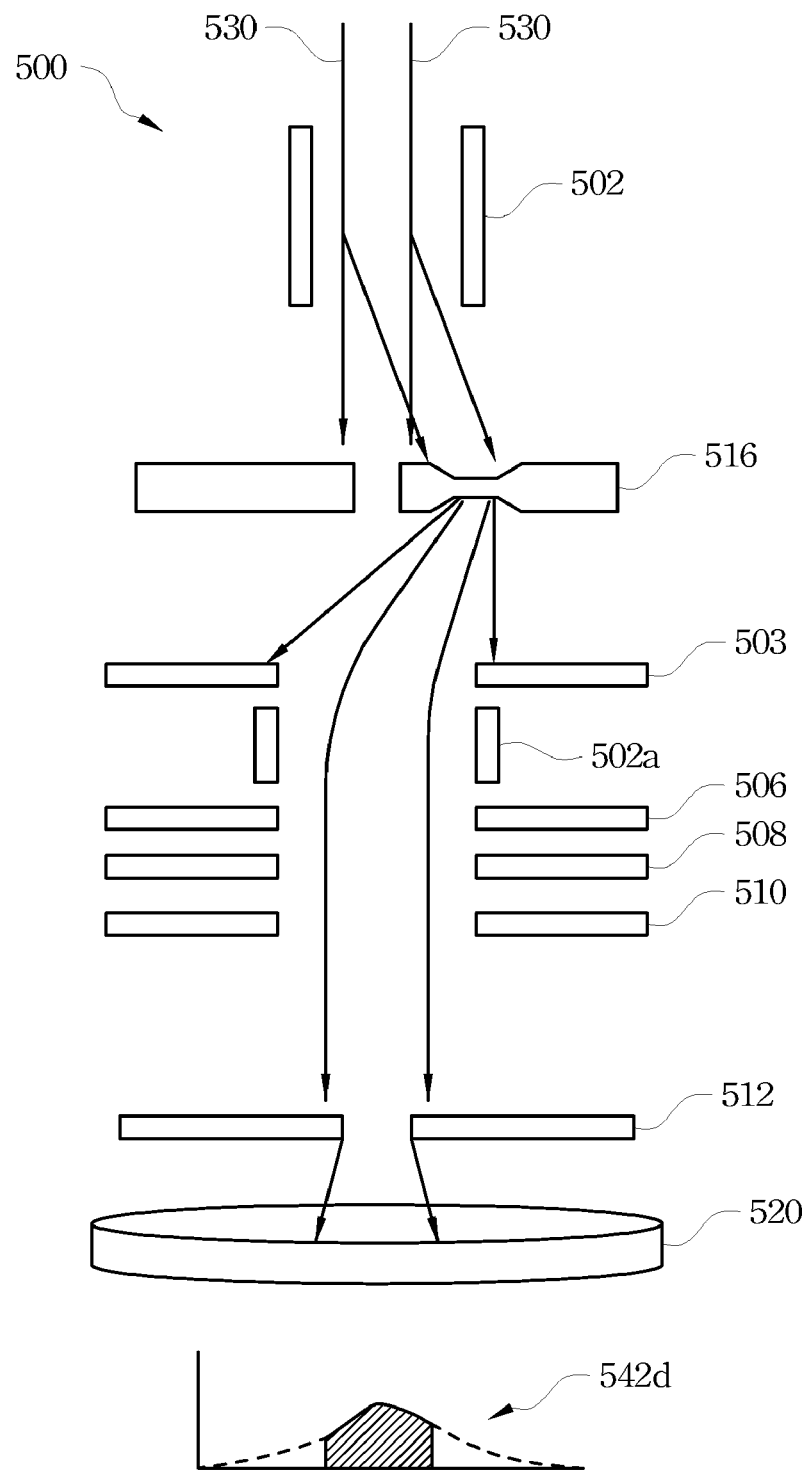

The e-beam system 500 tunes the electron beam 530 by deflecting the electron beam 530 onto a scattering aperture 516. The state of the electron beam 530 can be modified to various states in real-time by deflecting the electron beam 530 to various locations on the scattering aperture 516. For example, as illustrated in FIGS. 5A and 5B, the electron beam 530 is in a first state when the e-beam system 500 is in the "ON" state, in a second state when the e-beam system 500 is in the "OFF" state (the electron beam 530 is deflected to a non-scattering (beam stop) portion of the scattering aperture 516 (as denoted by the dashed electron beam line)), and in a third state when the e-beam system 500 is in the "POSITIVE DEFOCUS" or "NEGATIVE DEFOCUS" state (the electron beam 530 is deflected to a scattering portion of the scattering aperture 516 as illustrated in FIG. 5B).

As illustrated, the e-beam system 500 can change the state of the electron beam 530 by deflecting the electron beam 530 to various portions of the scattering aperture 516. The scattered electron beam provides similar defocusing effects, and may exhibit a faster deflection speed. The scattering aperture 516 is any suitable scattering aperture. The scattering aperture 516 includes scattering portions and non-scattering portions so that the electron beam 530 state may be modified from "ON", "OFF", "POSITIVE DEFOCUS", and/or "NEGATIVE DEFOCUS" states.

Figure 6A:
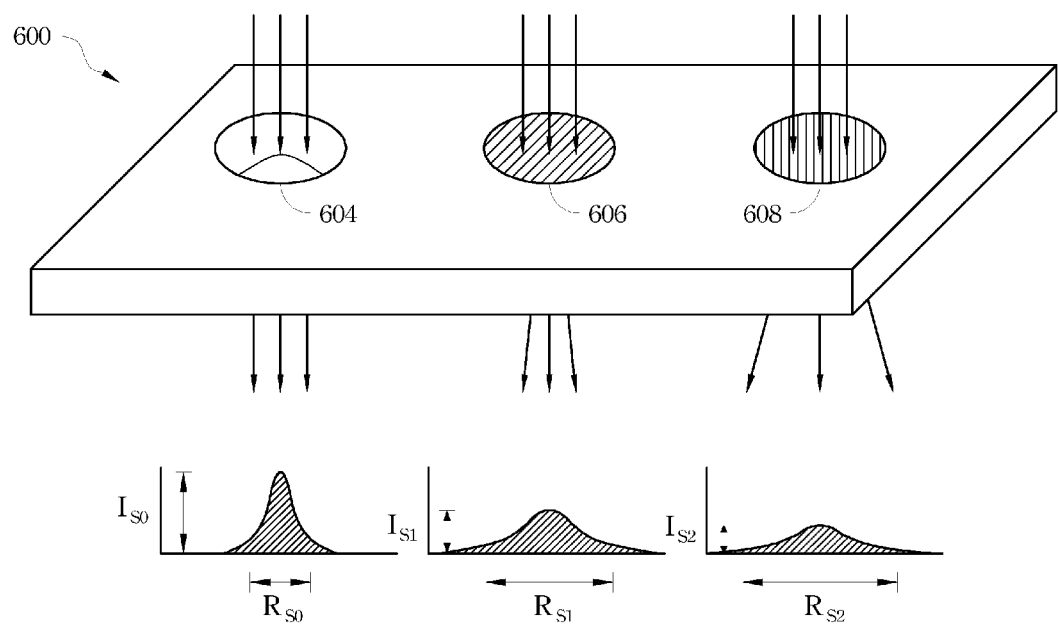
FIGS. 6A-6D are simplified representations of scattering apertures utilized within a lithography system according to aspects of the present disclosure.
Figure 6B:
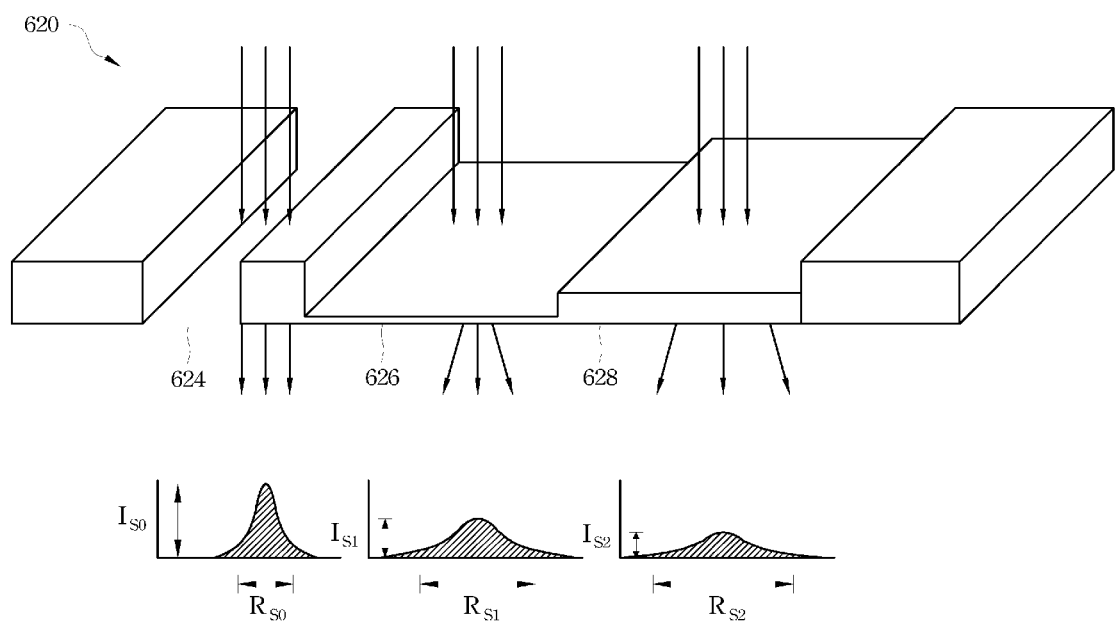
Figure 6C:
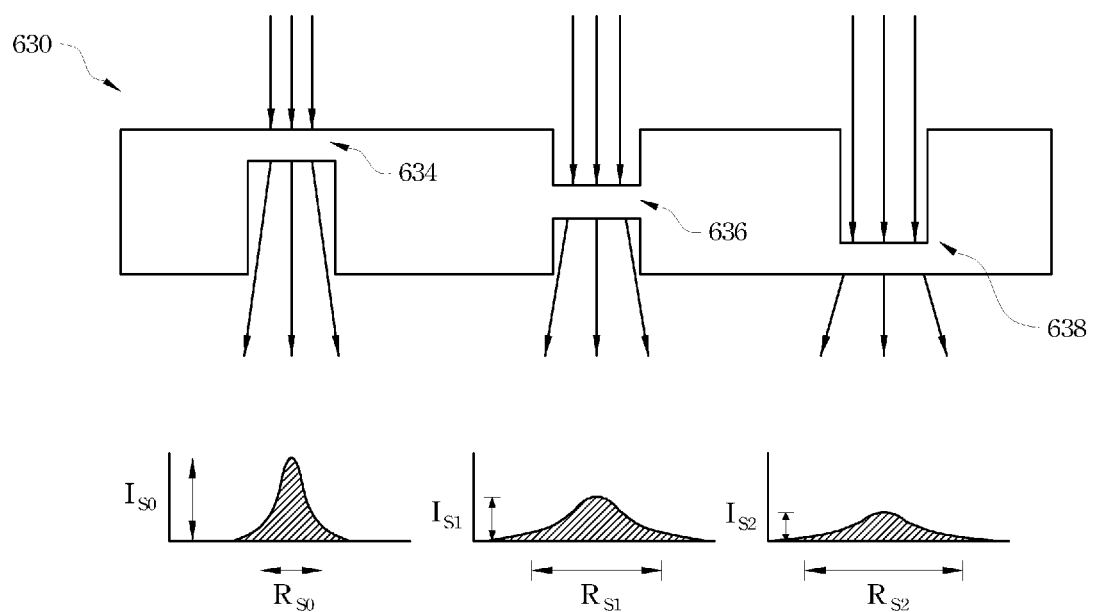
Figure 6D:
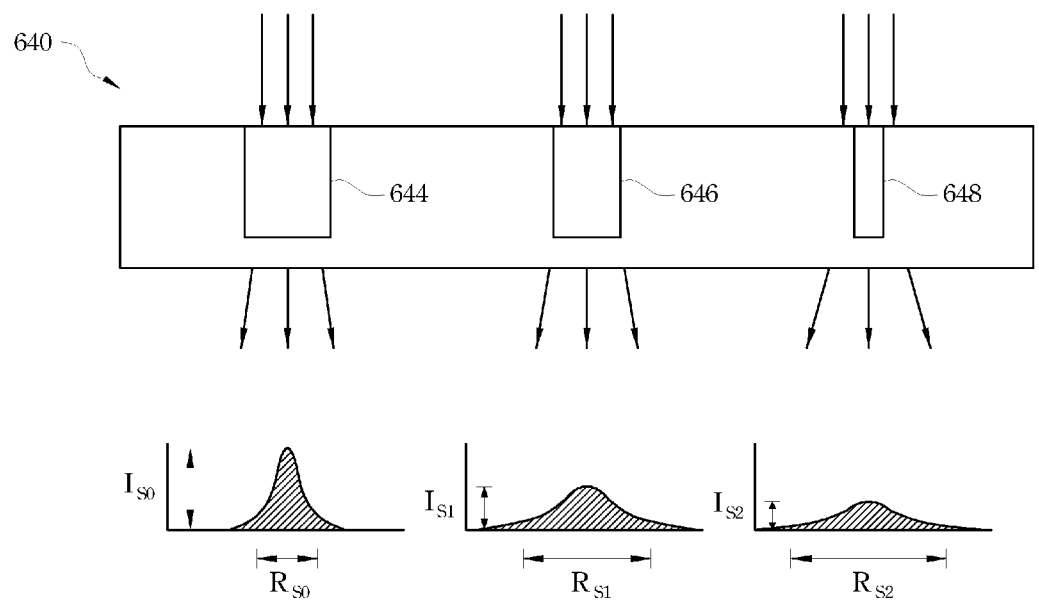

Exemplary scattering apertures are provided in FIGS. 6A-6D. For example, the scattering aperture 516 could be similar to a scattering aperture 600 including different materials (such as materials 604, 606, 608) as illustrated in FIG. 6A, where the scattering effect is determined by the material through which the electron beam is deflected onto. The scattering aperture 516 could be similar to a scattering aperture 620 including different thicknesses (such as thicknesses 624, 626, 628) as illustrated in FIG. 6B, where the scattering effect is determined by the thickness through which the electron beam is deflected onto. The scattering aperture 516 could be similar to a scattering aperture 630 including different depths (such as depths 634, 636, 638) as illustrated in FIG. 6C, where the scattering effect is determined by the depth through which the electron beam is deflected onto. The scattering aperture 516 could be similar to a scattering aperture 640 including different diameters (such as diameters 644, 646, 648) as illustrated in FIG. 6D, where the scattering effect is determined by the diameter through which the electron beam is deflected onto. The scattering aperture 516 could also be similar to apertures, such as a fan array scattering aperture, described in U.S. Pat. No. 5,532,496, entitled "Proximity Effect Compensation in Scattering-Mask Lithographic Projection Systems and Apparatus Therefore," which is incorporated herein by reference in its entirety. Other suitable scattering apertures are contemplated. It is understood that the scattering aperture 516 may comprise a single scattering aperture or multiple scattering apertures to modify or tune the state of the electron beam 530 that lands on the wafer 520.

In summary, a real-time exposure scheme for correcting proximity effects, referred to as the SPECIAL method, is disclosed. The real-time exposure scheme can be a single exposure scheme. The real-time exposure scheme includes redirecting an electron beam in an off state (or blank state) to a defocus state. Exposing a wafer to the defocus state can compensate for backscattered energy, thus correcting proximity effects. The electron beam is redirected to the defocus state by passing the electron beam through a range control aperture or onto a scattering aperture. The disclosed real-time exposure scheme provides one or more advantages, including but not limited to: (1) improving throughput, (2) requiring no shape or dosage changes to a pre-selected (main) pattern, (3) eliminating overlay issues, and/or (4) integrating easily into existing lithography hardware. Again, it is understood that different embodiments may have different advantages, and that no particular advantage is necessarily required of any embodiment. It is also contemplated that the SPECIAL method described in the present disclosure may be implemented in systems other than those described herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
   providing an energy sensitive resist material on a substrate;
   providing a desired pattern;
   performing a lithography process on the substrate, wherein the lithography process includes exposing the energy sensitive resist material to a charged particle beam, such that the desired pattern is transferred to the energy sensitive resist material; and
   directing the charged particle beam from an on state to an off state to a defocus state, wherein the defocus state compensates for the backscattered energy, thereby reducing proximity effects.

2. The lithography method of claim 1 wherein directing the charged particle beam from the off state to the defocus state comprises providing a range control aperture within a path of the charged particle beam to the energy sensitive resist material on the substrate.

3. The lithography method of claim 2 wherein providing the range control aperture within the path of the charged particle beam to the energy sensitive resist material on the substrate comprises modifying an adjustable portion of the range control aperture, such that varying openings are provided for the charged particle beam to pass through.

4. The lithography method of claim 1 wherein directing the charged particle beam from the off state to the defocus state comprises providing an adjustable range control aperture within a path of the charged particle beam to the energy-sensitive resist material on the substrate.

5. The lithography method of claim 4 wherein providing the adjustable range control aperture within the path of the charged particle beam to the energy-sensitive resist material on the substrate comprises modifying an adjustable portion of the adjustable range control aperture, such that varying openings are provided for the charged particle beam to pass through.

6. The lithography method of claim 1 wherein directing the charged particle beam from the off state to the defocus state comprises deflecting the charged particle beam onto a scattering aperture.

7. The lithography method of claim 6 wherein deflecting the charged particle beam onto the scattering aperture comprises providing the scattering aperture with different materials, thicknesses, depths, and/or diameters.

8. A lithography method comprising:
   providing an energy sensitive resist material on a substrate;
   providing a desired pattern;
   performing a lithography process on the substrate, wherein the lithography process includes exposing the energy sensitive resist material to a charged particle beam, such that the desired pattern is transferred to the energy sensitive resist material; and
   tuning the charged particle beam to more than one state during the lithography process, wherein the tuning comprising tuning from an on state to an off state and wherein at least one state compensates for backscattered energy, thereby reducing proximity effects.

9. The lithography method of claim 8 wherein tuning the charged particle beam to more than one state during the lithography process comprises tuning the charged particle beam to at least one of a positive defocus state, or a negative defocus state.

10. The lithography method of claim 8 wherein tuning the charged particle beam to more than one state during the lithography process comprises:
    tuning the charged particle beam to the on state to expose the energy sensitive resist material on the substrate to the desired pattern; and
    tuning the charged particle beam to a defocus state to expose the energy sensitive resist material on the substrate to a reverse field of the desired pattern.

11. The lithography method of claim 10 wherein tuning the charged particle beam to the defocus state to expose the energy sensitive resist material on the substrate to the reverse field pattern comprises directing the charged particle beam from an off state to the defocus state.

12. The method of claim 11 wherein directing the charged particle beam from the off state to the defocus state comprises directing the charged particle beam to a positive defocus state or a negative defocus state.

13. The method of claim 8 wherein tuning the charged particle beam to at least one state that compensates for backscattered energy, thereby reducing proximity effects, comprises passing the charged particle beam through a range control aperture.

14. The method of claim 8 wherein tuning the charged particle beam to at least one state that compensates for backscattered energy, thereby reducing proximity effects, comprises passing the charged particle beam to a scattering aperture, wherein the scattering aperture includes scattering and non-scattering portions.

15. A lithography method comprising:
performing a lithography process on an energy sensitive material on a substrate that delineates a desired pattern on the energy sensitive material using a charged particle beam, wherein the lithography process includes:
delineating the desired pattern on the energy sensitive material using the charged particle beam in an on state, wherein the charged particle beam passes through a main deflector, an aperture, and a projection lens system;
directing the charged particle beam in the on state to an off state by deflecting the charged particle beam to the aperture, wherein the aperture prevents the charged particle beam from landing on the substrate; and
directing the charged particle beam in the off state to a defocus state by passing the charged particle beam through the projection lens system.

16. The method of claim 15 wherein delineating the desired pattern on the energy sensitive material using the charged particle beam in the on state comprises exposing the energy sensitive material on the substrate to the desired pattern.

17. The method of claim 15 wherein directing the charged particle beam in the off state to the defocus state comprises exposing the energy sensitive material on the substrate to a reverse field of the desired pattern, wherein the reverse field of the desired pattern compensates for backscattered energy, thereby reducing proximity effects.

18. The method of claim 15 wherein directing the charged particle beam in the off state to the defocus state comprises passing the charged particle beam through a range control aperture.

19. The method of claim 15 wherein directing the charged particle beam in the off state to the defocus state comprises passing the charged particle beam through a scattering aperture.

20. The method of claim 15 wherein directing the charged particle beam in the on state to the off state by deflecting the charged particle beam to the aperture comprises deflecting the charged particle beam to a non-scattering portion of a scattering aperture.

* * * * *